United States Patent
Ogino et al.

(10) Patent No.: US 6,747,399 B1
(45) Date of Patent: Jun. 8, 2004

(54) PRESSURE-SENSITIVE SENSOR, OBJECT DETECTING DEVICE, AND OPENING-CLOSING DEVICE

(75) Inventors: Hiroyuki Ogino, Nara (JP); Naofumi Nakatani, Osaka (JP); Koji Yoshino, Nara (JP); Takeshi Nagai, Nara (JP); Narutoshi Kanazawa, Osaka (JP); Masahiko Ito, Nara (JP); Yuko Fujii, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/031,858
(22) PCT Filed: May 11, 2000
(86) PCT No.: PCT/JP00/03003
§ 371 (c)(1),
(2), (4) Date: Jun. 13, 2002
(87) PCT Pub. No.: WO00/70179
PCT Pub. Date: Nov. 23, 2000

(30) Foreign Application Priority Data

| May 13, 1999 | (JP) | 11-132250 |
| Jun. 3, 1999 | (JP) | 11-156121 |
| Aug. 23, 1999 | (JP) | 11-235039 |

(51) Int. Cl.$^7$ ............................................. H01L 41/08
(52) U.S. Cl. ...................... 310/330; 310/319; 310/339; 310/345
(58) Field of Search ................... 310/326, 328, 310/330, 338, 339, 345, 800

(56) References Cited

U.S. PATENT DOCUMENTS

| 3,465,476 A |   | 9/1969 | Rayner et al. |
| 3,903,733 A | * | 9/1975 | Murayama et al. ............ 73/574 |
| 4,943,757 A |   | 7/1990 | Richter et al. |
| 5,051,672 A |   | 9/1991 | Yaguchi |
| 5,554,907 A | * | 9/1996 | Dixon ......................... 310/339 |
| 5,770,914 A | * | 6/1998 | Pease et al. .................. 310/339 |
| 5,907,213 A |   | 5/1999 | Oshima et al. |

FOREIGN PATENT DOCUMENTS

| CH | 688354 | 8/1997 |
| DE | 3809957 | 10/1989 |
| DE | 4420361 | 12/1995 |
| DE | 195 35 796 | 3/1996 |
| GB | 2300732 | 11/1996 |
| JP | 41-15095 | 7/1941 |
| TW | 98366 | 4/1988 |
| WO | 94/08119 | 4/1994 |

* cited by examiner

Primary Examiner—Mark Budd
(74) Attorney, Agent, or Firm—RatnerPrestia

(57) ABSTRACT

In a pressure-sensitive sensor for detecting seizure of an object in the window frame or the like, support means (13) is more flexible than a piezoelectric sensor (12), and the support means (13) is easily deformed together with the piezoelectric sensor (12) without impeding the deformation of the piezoelectric sensor (12), and an output signal is issued from the piezoelectric sensor (12) depending on this deformation. Accordingly, when detecting the contact of an object with a pressure-sensitive sensor (4) by a judging device, the pressure-sensitive sensor (4) for generating an output signal of a sufficient magnitude for detection can be presented.

27 Claims, 24 Drawing Sheets

(a)

(b)

PRESSURE-SENSITIVE SENSOR, OBJECT DETECTING DEVICE, AND OPENING-CLOSING DEVICE

CROSS-RELATED APPLICATIONS

This application is a U.S. National Phase application of PCT Internation Application PCT/JP00/03003 filed May 11, 2000.

TECHNICAL FIELD

The present invention relates to a pressure-sensitive sensor, an object detecting device, and an opening-closing device used for preventing the seizure of an object in automobile power window, motor-driven slide door, motor-driven sun roof, automated door of building, etc.

PRIOR ART

Hitherto, a pressure-sensitive sensor is used for preventing the seizure of an object, such as a pressure-sensitive switch of a type of closing the contact by pressure as disclosed, for example, in U.S. Pat. No. 3,465,476 or Japanese Utility Model Publication No. 41-15095. This type of pressure-sensitive switch may cause detection errors when the pressure-sensitive switch is bent and closed when disposing along the window frame.

Accordingly, as a pressure-sensitive sensor not causing detection error if bent, a piezoelectric sensor has been disclosed. For example, U.S. Pat. No. 5,907,213 discloses an example of using a piezoelectric sensor having a non-piezoelectric region and a piezoelectric region as the pressure-sensitive sensor, in which only the portion having the piezoelectric region is disposed directly on the window frame of the power window. In this configuration, when closing the windowpane of the power window, if an object is seized between the window frame and the windowpane, the piezoelectric sensor is deformed by the pressure of the object, and a voltage pulse is issued from the piezoelectric sensor, and presence or absence of the object between the window frame and windowpane is detected depending on the presence or absence of this voltage pulse.

An opening-closing device using the piezoelectric sensor is disclosed in U.S. Pat. No. 4,943,757. It comprises a piezoelectric sensor built in a weather strip disposed in the window frame, and a motor for driving the windowpane on the basis of the output signal of the piezoelectric sensor. If an object is seized between the window frame and the windowpane when closing the windowpane, the piezoelectric sensor is deformed by the pressure of the object, and a voltage pulse is issued from the piezoelectric sensor, and when this voltage pulse exceeds seizure detection threshold, the motor is rotated in reverse direction, and the seizure is released.

In the piezoelectric sensor of U.S. Pat. No. 5,907,213, however, since it is directly disposed on the window frame, if the object presses the piezoelectric sensor, the piezoelectric sensor is hardly deformed. Accordingly, when detecting the seizure by an evaluation device, a sufficient voltage pulse for detection is not generated from the piezoelectric sensor.

In the opening-closing device of U.S. Pat. No. 4,943,757, unless the weather strip is sufficiently soft, if the object presses the piezoelectric sensor through the weather strip, the piezoelectric sensor is hardly deformed, and a sufficient voltage pulse is not issued from the piezoelectric sensor. Accordingly, the windowpane continues to close until the voltage pulse exceeds the seizure detection threshold, and the load applied to the object increases until the seizure is released, and the object may be broken, or the voltage pulse larger than the detection threshold is not generated, and the seizure is not released.

DISCLOSURE OF THE INVENTION

The invention is to solve these problems of the prior arts, and presents:

(A) A pressure-sensitive sensor disposed in an opening or an opening-closing unit, being easily deformed by pressure of an object;

(B) An object detecting device for detecting contact of an object with the pressure-sensitive sensor, securely by using the pressure-sensitive sensor; and (C) An opening-closing device capable of reducing the load applied to the object until releasing the seizure when the object is seized.

The pressure-sensitive sensor disclosed in the invention comprises:

(a) pressure-sensitive means for generating an output signal depending on deformation; and (b) support means for supporting the pressure-sensitive means at least on one of an opening, and an opening-closing unit for opening and closing this opening, in which the support means is more flexible than the pressure-sensitive means. Owing to this feature, when an object contacts with the pressure-sensitive sensor, the support means deforms easily together with the pressure-sensitive means so as not to impede deformation of the pressure-sensitive means, and the pressure-sensitive sensor generates a sufficient output signal for detection.

The sensitivity of the pressure-sensitive means is enhanced by providing the support means with a deformation amplifying portion for amplifying the deformation of the pressure-sensitive means. The sensitivity of the pressure-sensitive means is further enhanced by forming a hollow part in the deformation amplifying portion so that the hollow part is deformed by the pressure of the object to increase the deformation amount of the pressure-sensitive means.

When the support means is provided with a vibration damping unit, undesired vibration propagated to the pressure-sensitive means is damped, and the pressure-sensitive means does not issue such an output signal as to cause a detection error.

Further, when the vibration damping unit serves also as the deformation amplifying portion, and the support means is formed of a part of the weather strip of automobile, the components are reduced in number and rationalized.

As the pressure-sensitive means is disposed in the opening so that the shortest distance to the opening-closing unit is in a range of 3 mm to 5 mm, it is possible to detect the seizure of a bar of which minimum diameter is 4 mm or more as required in FMVSS118, which is the United States regulation about seizure in power window, etc.

The reliability is enhanced by disposing resistors for detecting breakage of electrodes between plural electrodes for leading out signals of the pressure-sensitive sensor.

The pressure-sensitive sensor may be also formed of a flexible piezoelectric sensor, so that the support means supports the piezoelectric sensor flexibly along the shape of the mounting portion. As a result, the degree of freedom of design of the mounting portion is heightened, and it is easy to increase the mechanical strength in design. Moreover, since the gap is narrowed between the pressure-sensitive sensor and the seizure portion, when an object is seized, the object securely contacts with the pressure-sensitive sensor.

The piezoelectric sensor is molded by using a compound piezoelectric material mixing amorphous chlorinated polyethylene, crystalline chlorinated polyethylene, and piezoelectric ceramic powder. Having both the flexibility of amorphous chlorinated polyethylene and the high temperature durability of crystalline chlorinated polyethylene, it is free from decreasing of sensitivity at high temperature as experienced in the conventional piezoelectric sensor using polyvinylidene fluoride as piezoelectric material, and the high temperature durability is excellent and vulcanizing process is not needed when molding, so that the production efficiency is superior.

The invention further presents an object detecting device comprising this pressure-sensitive sensor, and means for judging contact of an object on the basis of the output signal from the pressure-sensitive sensor.

The safety is enhanced by providing this object detecting device with notice means for reporting the judging result of the judging means to a third party.

By connecting the pressure-sensitive sensor directly to the judging means, and integrating the pressure-sensitive sensor and judging means into one body, connectors and other connecting parts are not necessary, contact failure and other troubles are eliminated, and the reliability is enhanced, and further the components are rationalized.

The judging means is further provided with a filter for extracting a specified frequency component only from the output signal of the pressure-sensitive sensor. The filter removes the output signal due to undesired vibration propagated to the pressure-sensitive sensor, and therefore the precision of judging contact of an object is enhanced. The reliability of the device is enhanced by judging function abnormality of the sensor on the basis of the output signal of the pressure-sensitive sensor corresponding to the vibration.

The object detecting device of the invention further includes a discharge unit for discharging the electric charge generated in the piezoelectric sensor. If the ambient temperature changes and an electric charge is generated in the piezoelectric sensor due to pyroelectric effect, since this electric charge is discharged by the discharging unit, it is free from judging errors of contact of an object due to changes of ambient temperature.

The judging means calculates the integrated value of the output signal of pressure-sensitive sensor per unit time, and judges contact of an object on the basis of this integrated value. Even if the pushing speed of pressure of the object to the pressure-sensitive sensor is slow, or even if a soft object contacts, the contact of the object can be judged securely.

Further in this object detecting device, a bypass unit for passing high frequency signals is provided between a signal input unit from the pressure-sensitive sensor and a signal output unit for issuing the judging result of contact of the object. As a result, if a strong electric field at high frequency is applied to the pressure-sensitive sensor or judging means and high frequency signals invade from the signal input unit, the high frequency signals are passed to the signal output unit to escape to outside of the judging means, judging errors do not occur. Further, by setting the signal input unit and signal output unit closer to each other and shortening the bypass route of the high frequency signals, judging errors of contact of an object do not occur if high frequency signals invade from the signal input unit.

Moreover, the invention presents an opening-closing device comprising this object detecting device, drive means for driving the opening-closing unit, and control means for controlling the drive means so as to open the opening-closing unit on the basis of the output signal of the judging means. This opening-closing device judges the contact with an object promptly and securely, and stops the closing action of the opening-closing unit or opens it. Therefore, the load applied to the object from beginning of the seizure of an object until cancellation of the seizure is reduced.

The opening-closing device of the invention further comprises a contact judging unit of the opening-closing unit for detecting the driving state such as opening or closing speed and driving current when the drive means drives the opening-closing unit, and judging contact of the object with the opening-closing unit on the basis of the detected driving state. The drive means is controlled on the basis of the output signal of either the judging unit or the object detecting device. For example, when either the object detecting device or the contact judging unit of the opening-closing unit judges the seizure, the drive means is controlled so as to stop the closing action of the opening-closing unit or to open it, so that the safety is enhanced.

If a function abnormality occurs in the object detecting device, the control means controls the drive means on the basis of the output signal of the contact judging unit of the opening-closing unit, so that the safety is enhanced.

In the opening-closing device of the invention, when closing the opening-closing unit, the control means controls the drive means so as to close after opening once for a specific distance or a specific time. In this method, if the pressure of the object is already applied to the pressure-sensitive sensor before closing the opening-closing unit and the pressure-sensitive sensor cannot be deformed, after the deformation of the pressure-sensitive sensor is once restored, the pressure-sensitive sensor is deformed again by the pressure of the object. As a result, contact of the object is judged, and the seizure of the object can be prevented.

BRIEF DESCRIPTION OF THE DRAWINGS

FIG. 3 (b) is an appearance view of pressure-sensitive sensor of the device as seen from the outside of the compartment.

FIG. 12 (b) shows other embodiment of pressure-sensitive sensor of the device, particularly depicting a sectional structure of a constitution of bending of side wall of support means.

FIG. 12(c) shows other embodiment of pressure-sensitive sensor of the device, particularly depicting a sectional structure of a constitution of exposure of a part of piezoelectric sensor to outside.

FIG. 12(d) shows other embodiment of pressure-sensitive sensor of the device, particularly depicting a sectional structure in which support means is formed of a part of weather strip 18.

DETAILED DESCRIPTION OF THE PREFERRED EMBODIMENTS

Embodiment 1

Embodiment 1 is described below while referring to FIG. 1 to FIG. 14.

Figure 1:
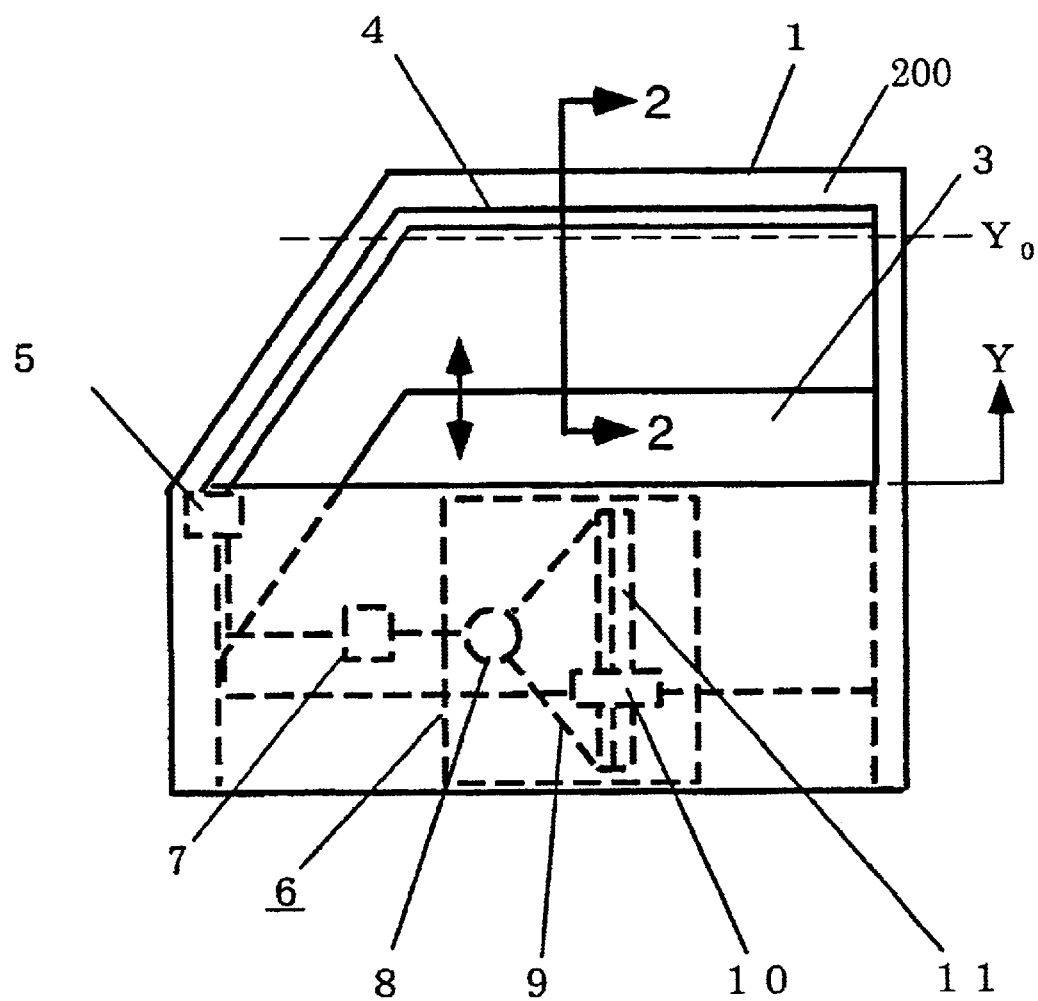
FIG. 1 is an appearance view of an object detecting device and an opening-closing device in embodiment 1 of the invention.
Figure 2:
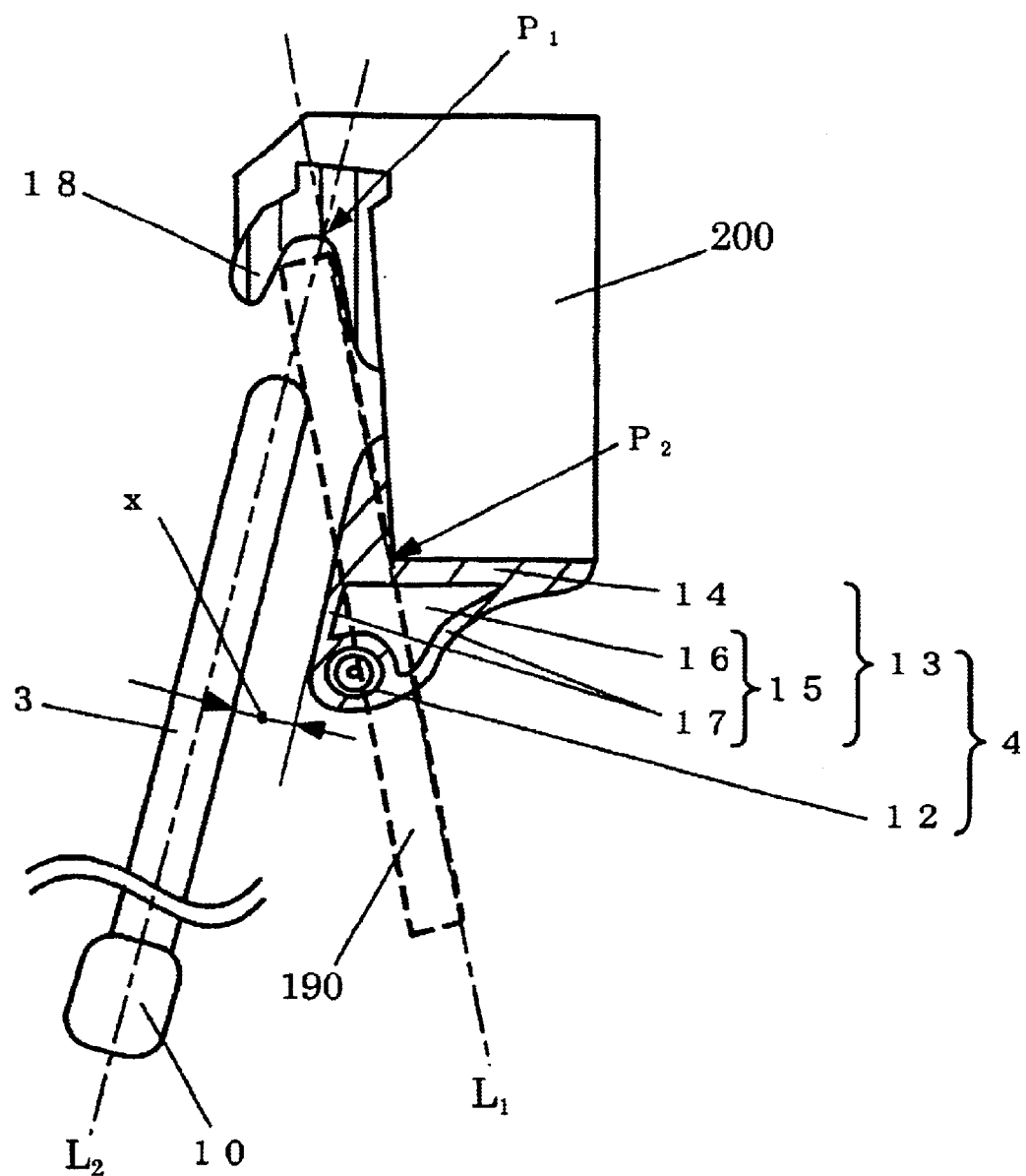
FIG. 2 is a sectional structural view at position 2—2 in FIG. 1.
Figure 3:
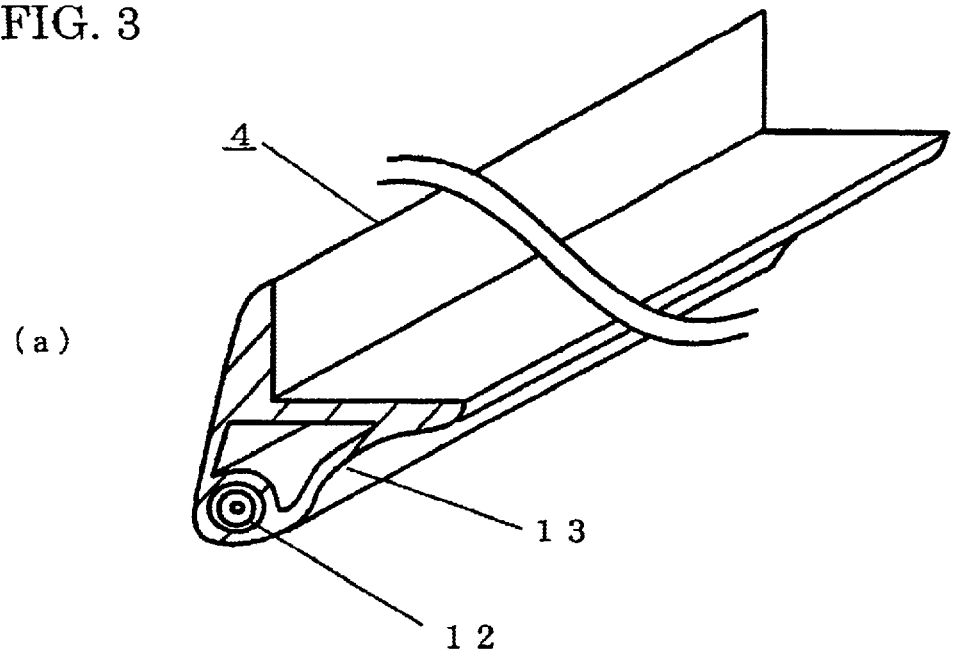
FIG. 3 (a) is an appearance view of pressure-sensitive sensor of the device as seen from the inside of the compartment.
Figure 3:
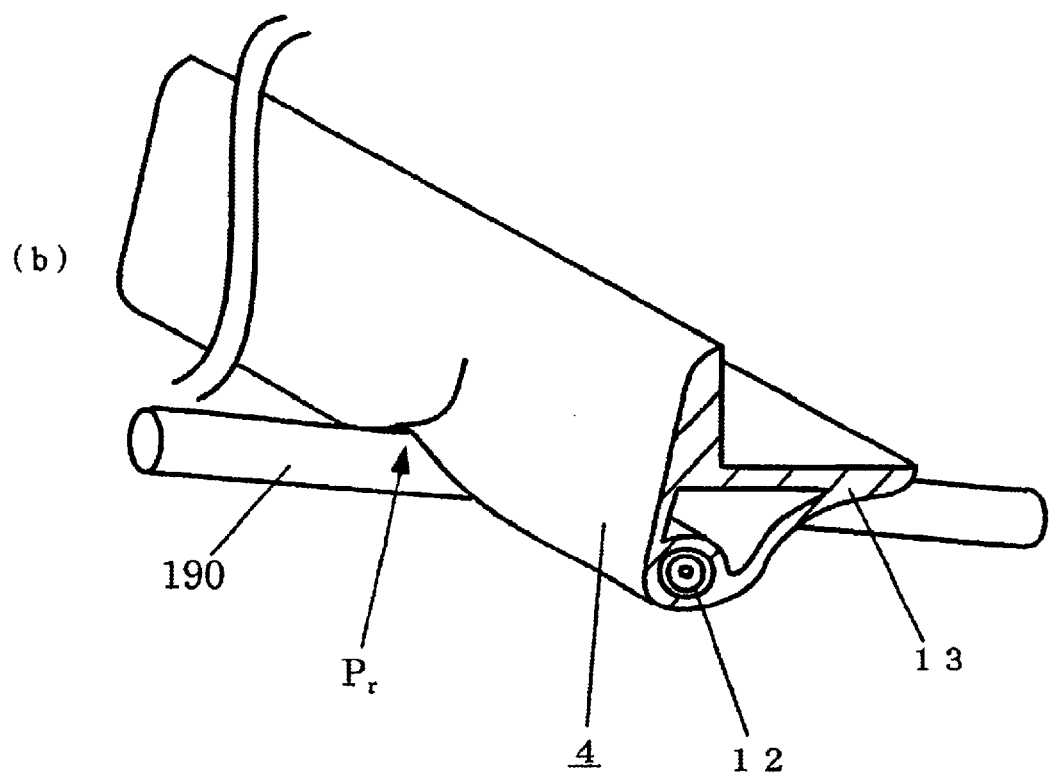

FIG. 1 is an appearance view of an object detecting device and an opening-closing device in embodiment 1, showing an example of application in a power window of an automobile, and FIG. 2 is a sectional structural view at position 2—2 in FIG. 1. In FIG. 2, the right side of the drawing shows the inside of the compartment, and the left side shows the outside of the compartment.

As shown in FIG. 1, an automobile door 1 has a window frame 200 as an opening, and a windowpane 3 as an opening-closing unit, and a pressure-sensitive sensor 4 is disposed on the end peripheral edge of the window frame 200. Judging means 5 judges contact of an object with the pressure-sensitive sensor 4 on the basis of an output signal from the pressure-sensitive sensor 4.

The opening-closing device comprises this object detecting device, drive means 6 for opening and closing the windowpane 3, and control means 7 for controlling the drive means 6. The drive means 6 is composed of a motor 8, a wire 9, a supporter 10 of windowpane 3, a guide 11 and others. The wire 9 is moved by the motor 8, and the supporter 10 coupled with the wire 9 is moved up and down along the guide 11, so that the windowpane 3 is opened and closed. The drive means 6 is not limited to this type using the wire 11, but may be realized by other method. The control means 7 may be integrated with the motor 8.

As shown in FIG. 2, the pressure-sensitive sensor 4 is composed of a flexible piezoelectric sensor 12 as pressure-sensitive means, and support means 13. The support means 13 includes an elastic body 14 of rubber or foamed resin member softer than the piezoelectric sensor 12, with the piezoelectric sensor 12 incorporated near the lowest position. Specifically, defining the compression load per unit deformation as the compressibility when the piezoelectric sensor 12 or elastic body 14 is compressed by a member of a specified shape, the elastic body 14 is made of such material that the compressibility of the elastic body 14 may be smaller than the compressibility of the piezoelectric sensor 12. Besides, for the ease of deformation of the piezoelectric sensor 12, the wall thickness of the support means 13 around the piezoelectric sensor 12 is reduced. The support means 13 has a deformation amplifying portion 15 for amplifying the deformation of the piezoelectric sensor 12. The deformation amplifying portion 15 has a hollow part 16 and a side wall 17. The support means 13 also includes a vibration damping portion for damping the vibration, and the vibration damping portion serves also as the side wall 17. The resonance frequency of the side wall 17 is preferred to be 10 Hz or less. A weather strip 18 is disposed in the window frame 200. If the compressibility of the elastic body 14 is greater than that of the piezoelectric sensor 12, by forming the deformation amplifying portion 15 having the hollow part 16, the compressibility of the support means 13 may be set smaller than that of the piezoelectric sensor 12.

The piezoelectric sensor 12 is preferred to be disposed in the window frame 200 so that the shortest distance to the windowpane 3 may be in a range of 3 mm to 5 mm. In this embodiment, as shown in FIG. 2, since the piezoelectric sensor 12 is incorporated in the support means 13, the support means 13 may be disposed in the window frame 200 so that the shortest distance (x) between the support means 13 and windowpane 3 may be in a range of 3 mm to 5 mm.

Alternatively, when an object 190 having specified dimensions as indicated by dotted line in FIG. 2 is seized in the windowpane 3 nearly at its end, the piezoelectric sensor 12 may be disposed in the window frame 200 so that a part of the piezoelectric sensor 12 may be positioned at the windowpane 3 side from the location (straight line $L_1$ in FIG. 2) of the object 190. Or, the piezoelectric sensor 12 may be disposed in the window frame 200 so that a part of the piezoelectric sensor 12 may be positioned in an angle formed by central axis $L_2$ and $L_1$ of the windowpane 3. Herein, $L_1$ may be determined as a straight line passing through the total closure top end (point $P_1$ in FIG. 2) of the windowpane 3 and the windowpane 3 side end (point $P_2$ in FIG. 2) of the window frame 200. As the object 190, a bar of 4 mm to 200 mm in diameter is used. The shape of the position of the pressure-sensitive sensor 4 fixed on the widow frame 200 is variable depending on the edge shape of the window frame 200.

FIG. 3(a) and FIG. 3(b) are appearance views of the pressure-sensitive sensor 4. FIG. 3(a) is an appearance view of the pressure-sensitive sensor 4 as seen from the inside of the compartment, and FIG. 3(b) is an appearance view of the pressure-sensitive sensor 4 as seen from the outside of the compartment, and in FIG. 3(b), the object 190 contacts with the pressure-sensitive sensor 4 at point P. The pressure-sensitive sensor 4 is affixed to the window frame 200 by means of double-side adhesive tape or adhesive agent. As other fixing methods, the pressure-sensitive sensor 4 may be fixed in the window frame 200 by means of a wedge shaped clip, or the pressure-sensitive sensor 4 may be fitted into a groove by forming a groove in the window frame 200.

Figure 4:
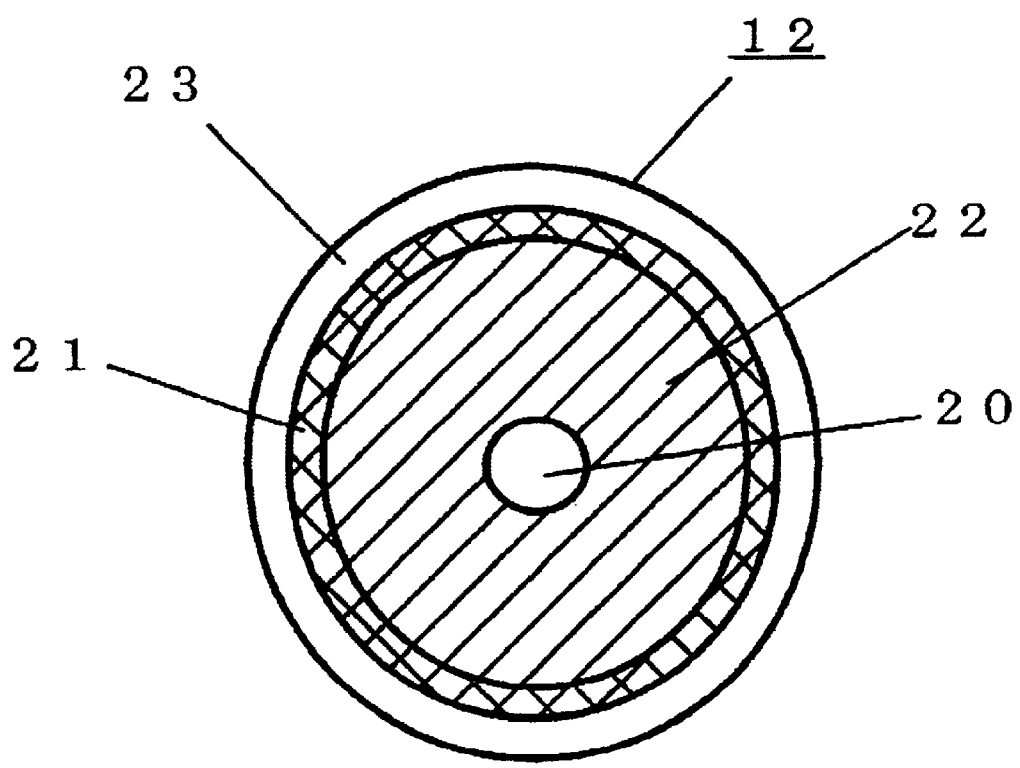
FIG. 4 is a sectional structural view of pressure-sensitive sensor of the device.

FIG. 4 is a sectional structural view of the piezoelectric sensor 12. The piezoelectric sensor 12 comprises:
(a) a central electrode 20 as an electrode for leading out a signal,
(b) an outside electrode 21,
(c) a composite piezoelectric layer 22 of a composite piezoelectric material mixing sintered powder of piezoelectric ceramic in a rubber elastic body mixing amorphous chlorinated polyethylene and crystalline chlorinated polyethylene, and
(d) a covering layer 23, which are concentrically laminated, formed into a cable, and polarized, and this composition has an excellent flexibility, and generates an output signal depending on deformation. As the piezoelectric ceramic, for example, sintered powder of lead titanate or lead titanic acid zirconate is used.

The piezoelectric sensor 12 is manufactured in the following process. First, chlorinated polyethylene sheet and powder of (40 to 70) vol. % piezoelectric ceramic (herein, lead titanic acid zirconate) are mixed uniformly into a sheet by a rolling method. This sheet is finely cut into pellets, and these pellets are extruded continuously with the central electrode 20, and the composite piezoelectric layer 22 is formed. The outside electrode 21 is wound around the composite piezoelectric layer 22. The covering layer 23 surrounding the outside electrode 21 is extruded continuously. Finally, to polarize the composite piezoelectric layer 22, a direct-current high voltage of 5 to 10 kV/mm is applied between the central electrode 20 and outside electrode 21.

For this chlorinated polyethylene sheet, a mixture of amorphous chlorinated polyethylene and crystalline chlorinated polyethylene is used. In this case, considering the extrusion processability, flexibility, and piezoelectric characteristic, it has been experimentally disclosed that it is preferred to use chlorinated polyethylene mixing 75 wt. % of amorphous chlorinated polyethylene with molecular weight of 60,000 to 150,000, and 25 wt. % of crystalline chlorinated polyethylene with degree of crystallinity of 15 to 25% and molecular weight of 200,000 to 400,000. This mixed chlorinated polyethylene can contain piezoelectric ceramic powder by about 70 vol. %.

When adding piezoelectric ceramic powder to this mixed chlorinated polyethylene, it is preferred to immerse the piezoelectric ceramic powder preliminarily in a solution of titanium coupling agent, and dry. By this treatment, the surface of the piezoelectric ceramic powder is covered with hydrophilic group and hydrophobic group contained in titanium coupling agent. The hydrophilic group prevents aggregation of piezoelectric ceramic powder particles, and the hydrophobic group increases wettability of mixed chlorinated polyethylene and piezoelectric ceramic powder. As a result, the piezoelectric ceramic powder can be added uniformly in the mixed chlorinated polyethylene by a large content of up to 70 vol. %. Instead of immersion in the titanium coupling agent solution, by adding the titanium coupling agent when rolling the mixed chlorinated polyethylene and piezoelectric ceramic powder, it has been known that the same effects as above are obtained. This treatment is excellent in the aspect that it does not require any particular immersion treatment in the titanium coupling agent solution.

The central electrode 20 may be an ordinary metal single wire conductor, but an electrode winding a metal coil around the insulating polymer fiber is used in this embodiment. As the insulating polymer fiber, polyester fiber used commercially in heated blanket is used, and as the metal coil, copper alloy containing silver by 5 wt. % is preferred.

The outside electrode 21 is a band-shaped electrode having a metal film adhered on the polymer layer, and it is wound around the composite piezoelectric layer 22. As the polymer layer, polyethylene terephthalate (PET) is used, and the electrode having an aluminum film adhered thereon has a high thermal stability at 120° C. and is mass-produced commercially, and hence it is preferred as the outside electrode 21. When connecting this electrode to the judging means 5, it is hard to solder the aluminum film, and hence it is connected, for example, by crimping or by using eyelet. Or by winding metal single wire coil or metal braided wire around the aluminum film of the outside electrode 21 to conduct with the aluminum film, the metal single wire coil or metal braided wire may be soldered to the judging means 5. In this case, soldering is possible, and the working efficiency is improved. Meanwhile, to shield the piezoelectric sensor from electric noise of the external environments, it is preferred to wind the outside electrode 21 around the composite piezoelectric layer 22 so as to be overlaid partially.

As the covering layer 23, vinyl chloride or polyethylene may be used, or for the ease of deformation of piezoelectric sensor 12 at the time of pressing by the object, it is also preferred to use an elastic material such as rubber having higher flexibility or elasticity than the composite piezoelectric layer 22. It is selected in consideration of heat resistance and cold resistance as car-mount parts, and specifically it is preferred to select a material not lowered in flexibility at −30° C. to 85° C. As such rubber, for example, ethylene propylene rubber (EPDM), chloroprene rubber (CR), butyl rubber (IIR), silicone rubber (Si), or thermoplastic elastomer may be used. In this constitution, the minimum curvature of the piezoelectric sensor is reduced up to a radius of 5 mm.

Figure 5:
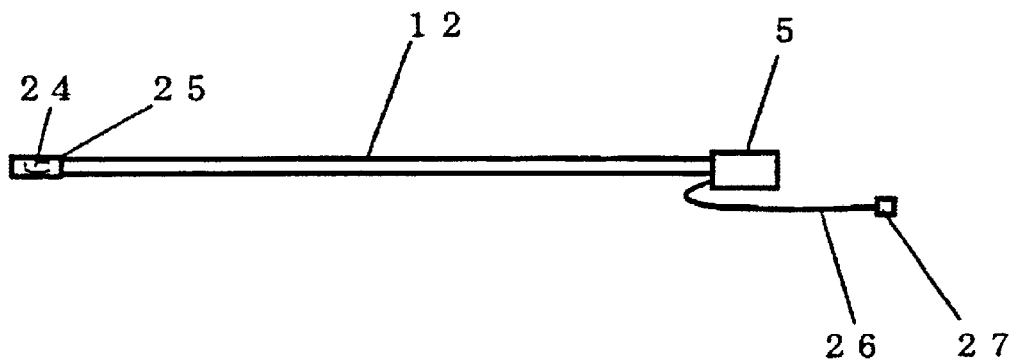
FIG. 5 is an appearance view of pressure-sensitive sensor of the device.

FIG. 5 is an appearance view of the piezoelectric sensor 12, and a resistor for detecting breakage 24 is incorporated in one end 25 of the piezoelectric sensor 12. The resistor for detecting breakage 24 is connected between the central electrode 20 and outside electrode 21 of the piezoelectric sensor 12. The resistor for detecting breakage 24 serves also as the discharge unit for discharging the electric charge generated in the piezoelectric sensor 12 by pyroelectric effect, and the components are rationalized. The piezoelectric sensor 12 is directly connected to the judging means 5, and the piezoelectric sensor 12 and judging means 5 are integrated. Further, a cable 26 and a connector 27 for supply of power source and output of detection signal are connected to the judging means 5. When disposing the piezoelectric sensor 12 in the support means 13, the resistor for detecting breakage 24 is incorporated in the end 25, and the piezoelectric sensor 12 is inserted into the support means 13, and the piezoelectric sensor 12 and judging means 5 are connected into one body. Or, when forming the support means 13 by extrusion molding, the piezoelectric sensor 12 may be extruded simultaneously, and the piezoelectric sensor 12 may be disposed in the support means 13, and then the resistor for detecting breakage 24 may be incorporated in the end 25, so that the piezoelectric sensor 12 and judging means 5 may be integrated.

Figure 6:
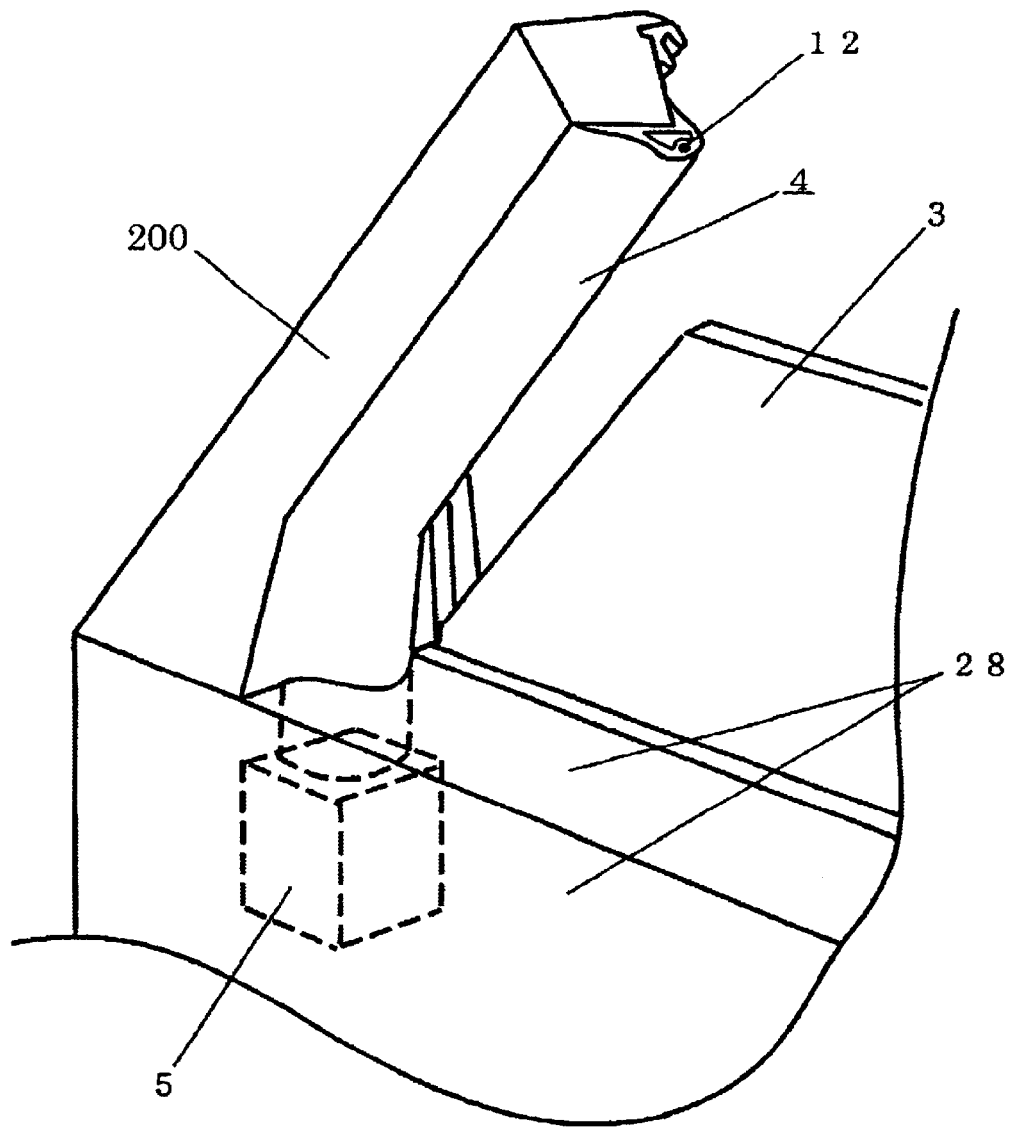
FIG. 6 is a structural view showing the configuration of pressure-sensitive sensor and judging means of the device.
Figure 7:
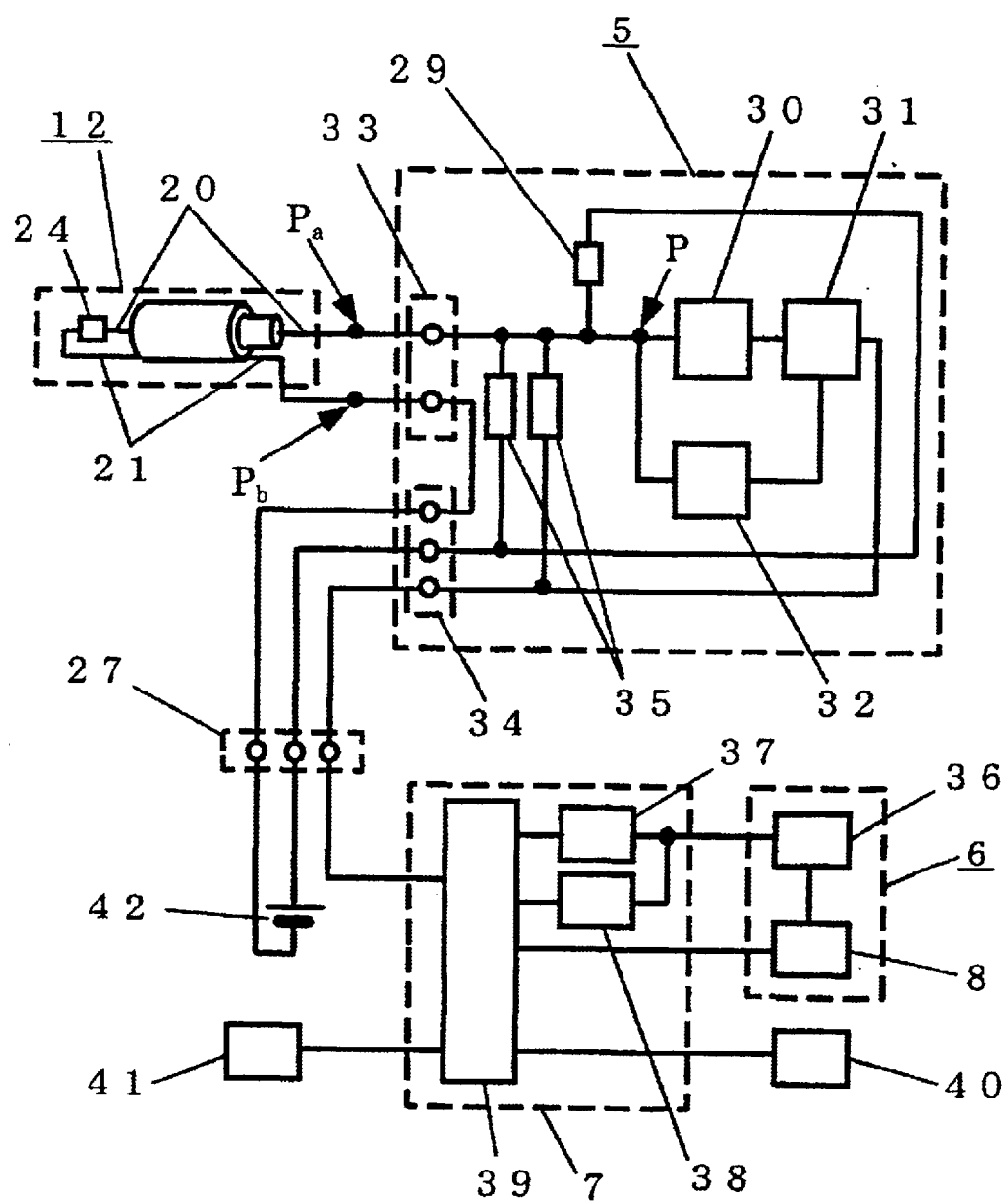
FIG. 7 is a block diagram of the device.

FIG. 6 is a structural view showing the configuration of the pressure-sensitive sensor 4 and judging means 5. As shown in FIG. 6, since the pressure-sensitive sensor 4 is directly connected to the judging means 5 to be integrated, the cable for connecting the pressure-sensitive sensor 4 and judging means 5 is not needed. Besides, the laying distance of the pressure-sensitive sensor 4 in the place outside of the window frame 200 is short, so that the pressure-sensitive sensor 4 is free from effects of undesired vibrations from the door member 28. The judging means 5 is disposed inside of the door member 28, for example, near the mounting position of the side mirror. In the portion of the pressure-sensitive sensor 4 contacting with the door member 28, a vibration damping(absorbing) member may be disposed so that chattering of the door member 28 or undesired vibration may not be transmitted to the pressure-sensitive sensor 4 from the car body through the door member 28. FIG. 7 is a block diagram of an object detecting device and opening-closing device in embodiment 1. The object detecting device comprises a piezoelectric sensor 12, a filter 30 for passing specified frequency components only from the output signal of the piezoelectric sensor 12, a judging unit 31 for judging contact of an object with the pressure-sensitive sensor 4 on the basis of the output signal from the filter 30, and an abnormality judging unit 32 for judging breakage of the central electrode 20 and outside electrode 21 of the piezoelectric sensor 12 depending on the voltage value formed by the resistor for detecting breakage 24 and a resistor for dividing voltage 29. Further, a signal input unit 33 for feeding the output signal from the piezoelectric sensor 12 into the judging means 5, and a signal output unit 34 for issuing the judging signal from the judging unit 31 are disposed closely to each other in the judging means 5. The signal output unit 34 has a power source line to the judging means 5 and a grounding line. A bypass unit 35 for passing high frequency signals provided between the signal input unit 33 and signal output unit 34 is composed of a capacitor.

The drive means 6 has a Hall element 36 for detecting rotation of the motor 8. The control means 7 comprises a position detector 37 for detecting the upper end position of the windowpane 3 on the basis of the output signal from the Hall element 36, a contact judging unit 38 of an opening-closing unit for judging contact of an object with the windowpane 3 by detecting the moving speed of the windowpane 3 on the basis of the output signal from the Hall element 36, and a controller 39 for controlling the motor 8 on the basis of the output signals from the judging means 5, position detector 37 and the contact judging unit 38 of the opening-closing unit.

The position detector 37 detects the present position of the upper end of the windowpane 3 by counting and storing the pulse signals issued from the Hall element 36. Herein, the upper end position Y of the windowpane 3 is expressed by the height from the lowest point of the window frame 200 as shown in FIG. 1.

The contact judging unit 38 of the opening-closing unit judges contact of the object, seeing that the moving speed of the windowpane 3 slows down when the object contacts with the windowpane 3. Specifically, from the pulse interval of pulse signals issued from the Hall element 36, the moving speed of the windowpane 3 is calculated, and when the difference of the calculating moving speed per unit time $|\Delta V_w|$ becomes larger than a predetermined value $V_{w1}$, it is judged that the object is in touch with the windowpane 3, and a pulse signal of Lo→Hi→Lo is issued as judging signal.

The opening-closing device further comprises notice means 40 for noticing the judging result of the judging means 5 by a specified light or the like placed in the front panel in the compartment, an opening-closing switch 41 for opening and closing the windowpane 3, and a power source 42 composed of car batteries. The switch 41 comprises an auto-up switch and an auto-down switch for opening and closing the windowpane 3 by one-touch operation, and a manual-up switch and a manual-down switch for opening and closing the windowpane 3 by manual operation.

The filter 30 removes undesired signals due to vibration of car body of the automobile and others from the output signal of the piezoelectric sensor 12. The filter 30 has such filtering characteristic as to extract only specific frequency components appearing in the output signal when the piezoelectric sensor 12 is deformed due to pressure by contact with the object. The filtering characteristic is determined by optimizing by analyzing the vibration characteristic of the car body of the automobile and car body vibration in running. Specifically, to eliminate the noise of vibrations due to automobile engine and running, the filter 30 is preferred to be low pass filter for extracting signal components of about 10 Hz or less.

The judging means 5 for eliminating incoming electric noise shields electrically by covering the entire structure with a shielding member. The outside electrode 21 conducts with the shield member of the judging means 5, and shields the pressure-sensitive sensor 12 electrically. Or, by adding a through-capacitor or EMI filter in the input and output unit of the circuit, countermeasures against strong electric field may be provided.

Figure 8:
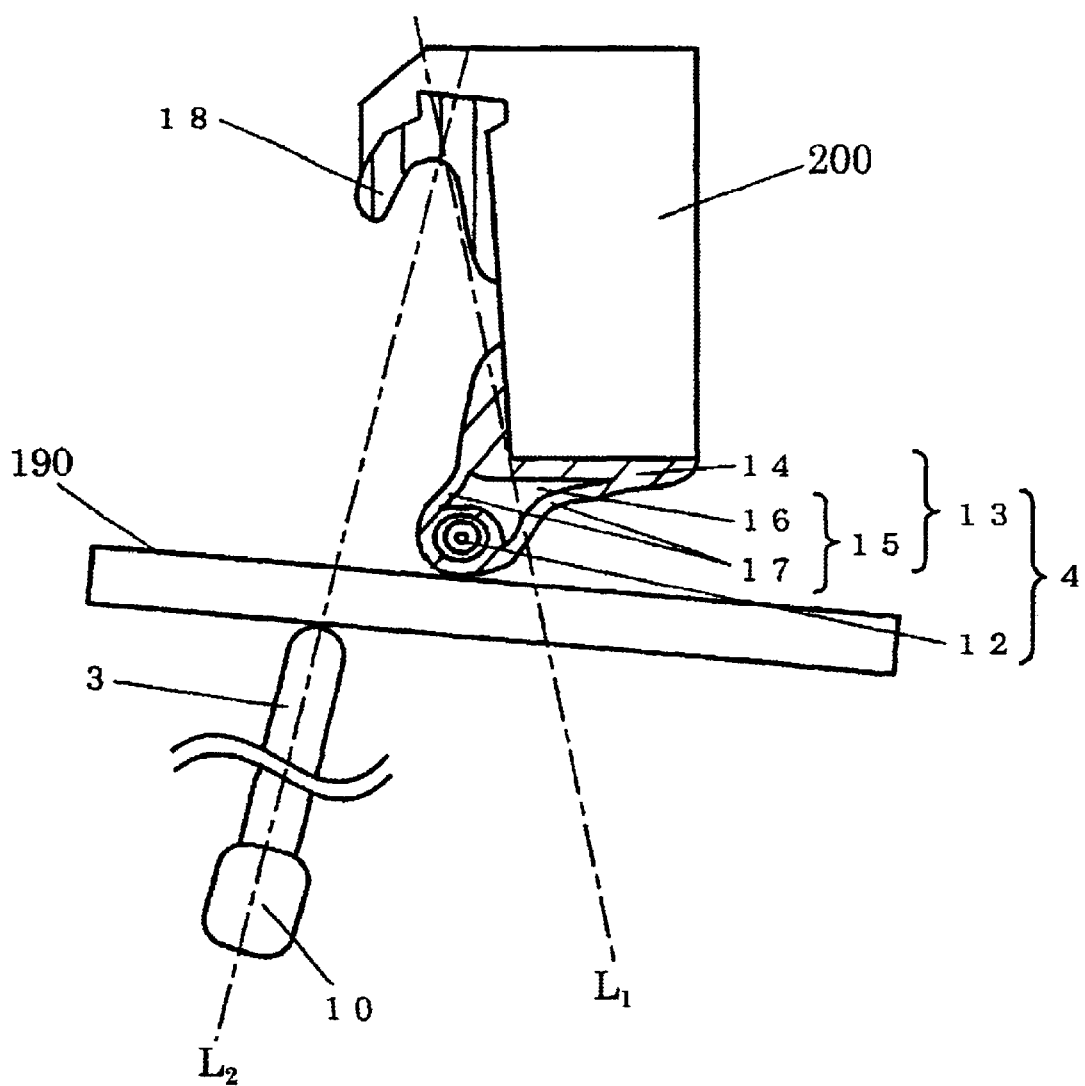
FIG. 8 is a sectional view at position 2—2 in FIG. 1 in the event of the seizure of an object.

The operation of detecting contact of an object with the pressure-sensitive sensor 4 by the object detecting device is explained. FIG. 8 is a sectional structural view at position 2—2 in FIG. 1 in the event of invasion and the seizure of the object 190 between the window frame 200 and windowpane 3. As shown in FIG. 8, when the object 190 contacts with the pressure-sensitive sensor 4, the pressure by the object 190 is applied to the support means 13 and piezoelectric sensor 12. Since the support means 13 is more flexible than the piezoelectric sensor 12, as shown in FIG. 3(b), the support means 13 is compressed by the pressure from the object 190 at contacting point $P_r$, and the side wall 17 is deformed, and the hollow part 16 is crushed at the same time. As a result, the piezoelectric sensor 12 is also bent and deformed from the point $P_r$ of the object 190 contacting with the support means 13.

Figure 9:
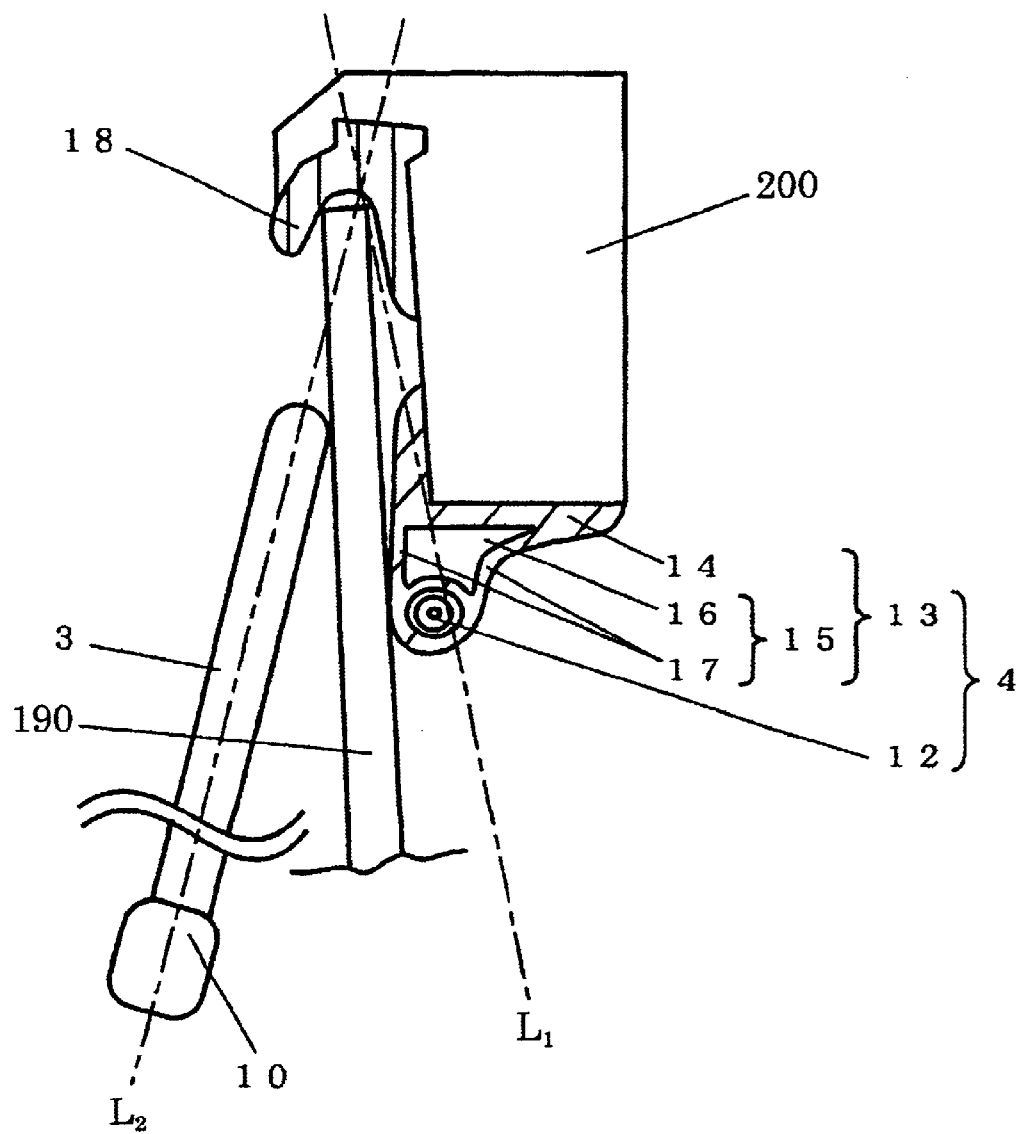
FIG. 9 is a sectional structural view at position 2—2 in FIG. 1 in the event of the seizure of an object near its end.

FIG. 9 is a sectional structural view at position 2—2 in FIG. 1 in the event of the end portion of the object 190 invading to be seized between the window frame 200 and windowpane 3. As shown in FIG. 9, in this embodiment, since the pressure-sensitive sensor 4 is positioned at the windowpane 3 side from $L_1$, the support means 13 is compressed by the object 190 as same as in the case above, and the side wall 17 is deformed, and the hollow part 16 is crushed at the same time, so that the piezoelectric sensor 12 is deformed. In the embodiment shown in FIG. 2, moreover, since the distance (x) of the piezoelectric sensor 12 and windowpane 3 is set so as to be in a range of 3 mm to 5 mm, if the object 190 of 4 mm in diameter is seized as in FIG. 9, the piezoelectric sensor 12 is deformed by the pressure from the object 190.

Comparing the structure of the support means 4 not having the hollow part 16 and the structure of this embodiment, the hollow part 16 is crushed by the pressure from the object in the structure of the embodiment, and the degree of compression of the support means 13 is larger, so that the piezoelectric sensor 12 is deformed more significantly.

When the piezoelectric sensor 12 is deformed in this manner, the piezoelectric sensor 12 issues an output signal depending on the deformation by the piezoelectric effect. A specific frequency component is extracted by the filter 30 from the output signal of the piezoelectric sensor 12. At this time, through the window frame 200, vibrations of automobile engine and running are propagated to the pressure-sensitive sensor 4, but the Bide wall 17 provided in the support means 13 serves also as vibration damping portion, and such vibrations are removed. Vibration components not removed by the side wall 17 are applied to the piezoelectric sensor 12, and an output signal including such undesired vibration components appears in the output signal of the piezoelectric sensor 12, but the filter 30 removes undesired signals due to vibrations of car body of the automobile and the like.

Figure 10:
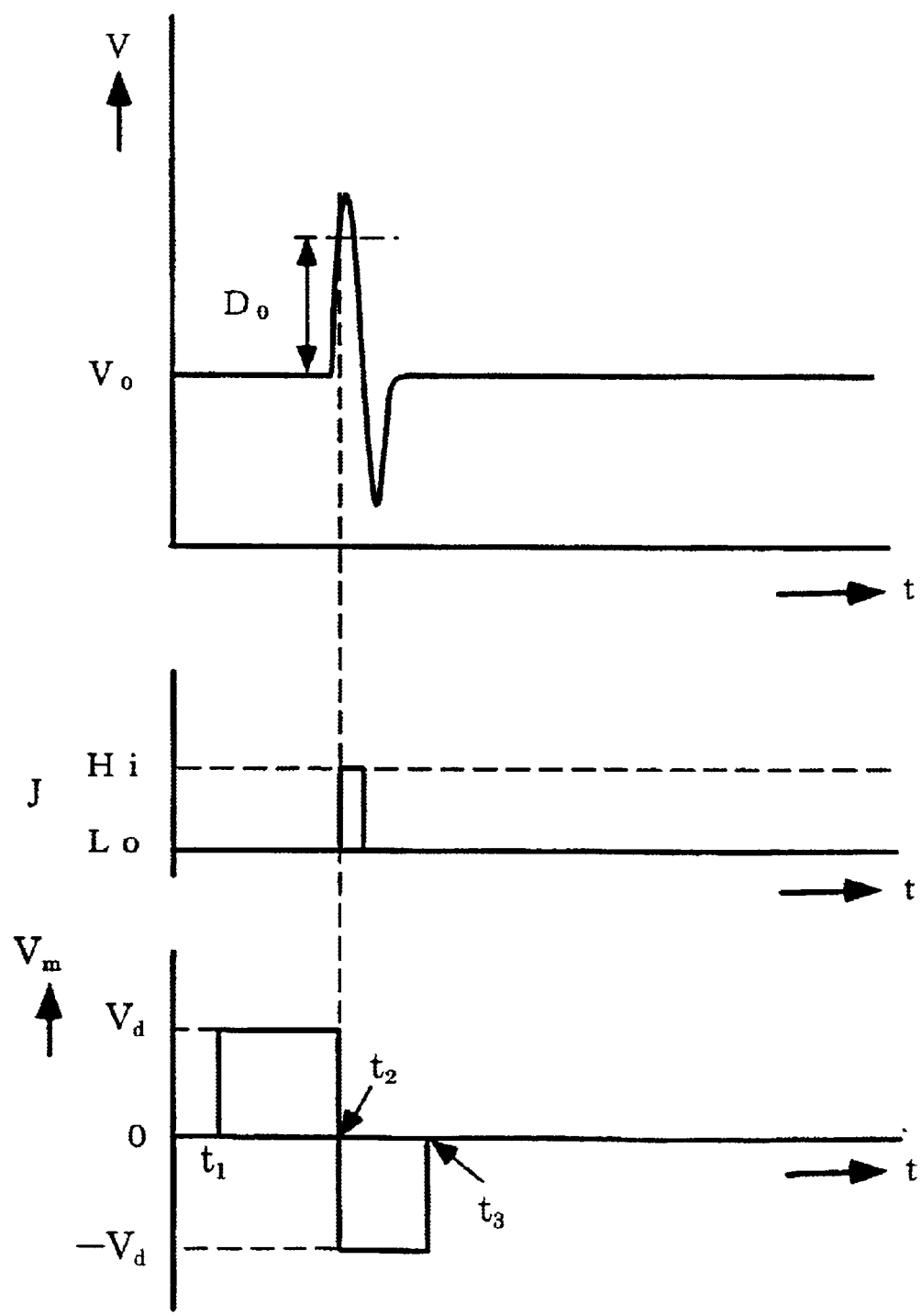
FIG. 10 is a waveform diagram of output signal V from filter of the device, judging output J of the seizure judging unit, and applied voltage $V_m$ to motor.

The operating procedure of the judging unit 31 and controller 39 is explained by referring to FIG. 10. FIG. 10 is a waveform diagram showing the output signal V from the filter 30, judging output J of the judging means 5, and applied voltage $V_m$ to the motor 8. The axis of ordinates in FIG. 10 denotes V, J, and $V_m$ sequentially from the top, and the axis of abscissas represents the time t. When the auto-up switch of the opening-closing switch 41 is turned on at time $t_1$, the controller 39 applies a voltage of $+V_d$ to the motor 8, and closes the windowpane 3. The judging means 5 is enabled to judge when closing the windowpane 3. As shown in FIG. 8 or FIG. 9, when the object 190 is seized, the piezoelectric sensor 12 issues a signal depending on the acceleration of deformation of the piezoelectric sensor 12 due to piezoelectric effect, and the filter 30 produces a larger signal component than the reference potential $V_0$ as shown in FIG. 10. At this time, in such a constitution that only the piezoelectric sensor 12 is disposed on the window frame 200, the deformation of the piezoelectric sensor 12 at the time of seizure is slight, but in this embodiment, since the support means 13 is formed of a more flexible elastic body 14 than the piezoelectric sensor 12 as shown in FIG. 2 and the support means 13 is easily compressed at the time of seizure, the deformation of the piezoelectric sensor 12 increases. Since the hollow part 16 is also crushed at the time of seizure, the deformation of the piezoelectric sensor 12 is further increased. Thus, the piezoelectric sensor 12 is largely deformed, and the acceleration which is the quadratic differential of deformation also increases, so that the output signal of the piezoelectric sensor 12 increases. The judging unit 31 judges that the object is in contact when the amplitude $|V—V_0|$ of V from $V_0$ is larger than $D_0$, and issues a pulse signal of Lo→Hi→Lo as judging output at time $t_2$. Receiving this pulse signal, the controller 39 stops application of voltage of $+V_d$ to the motor 8, and applies voltage $-V_d$ for a specific time until time $t_3$ to lower the windowpane 3 by a specific extent, thereby releasing the seizure. When releasing the seizure, the piezoelectric sensor 12 issues a signal depending on the acceleration of restoration of deformation (a smaller signal component than reference potential $V_0$ in FIG. 10).

Whether V is larger than $V_0$ or not at the time of seizure varies depending on the deforming direction or polarizing direction of the piezoelectric sensor 12, allocation of electrode (which should be reference potential), and the supporting direction of the piezoelectric sensor 12, but since the judging unit 31 judges the seizure on the basis of the absolute value of the difference of V and $V_0$, and therefore the seizure can be judged regardless of negative or positive of the value of $V-V_0$.

This is the operation when detecting contact of an object with the pressure-sensitive sensor 4. In this embodiment, the contact judging unit 38 of the opening-closing unit also detects contact of an object with the windowpane 3. The controller 39 stops application of voltage $+V_d$ to the motor 8 when receiving at least one detection signal of the detection signal by the judging unit 31 and the detection signal by the contact judging unit 38 of the opening-closing unit if the upper end position Y of the windowpane 3 detected by the position detector 37 is lower than $Y_0$ in FIG. 1, and applies a voltage $-V_d$ for a specific time to lower the windowpane 3 by a specific extent. If Y is higher than $Y_0$, the controller 39 stops application of voltage $+V_d$ to the motor 8 on the basis of the input of detection signal by the judging unit 31 only, and applies a voltage $-V_d$ for a specific time to lower the windowpane 3 by a specific extent. The reason why the controller 39 does not refer to the detection signal by the contact judging unit 38 of the opening-closing unit when Y is higher than $Y_0$ is that if detected by the contact judging unit 38 of the opening-closing unit in the region where Y is larger than $Y_0$, when fully closing the windowpane 3, $|\Delta V_w|$ becomes larger than $V_{w1}$, and a detection signal is issued. In order to widen the region of the object detection by both of the object detecting device and the contact judging unit 38 of the opening-closing unit as much as possible, $Y_0$ should be set near the lowest end of the pressure-sensitive sensor 4. Specifically, considering the detection of the seizure by a bar of a minimum diameter of 4 mm as required in FMVSS118 which is the United States regulation about seizure in power window or the like, $Y_0$ is preferred to be set at a position of 3 mm to 5 mm at lower side from the lowest end of the pressure-sensitive sensor 4.

The operation of the object detecting device and opening-closing device explained herein is the operation when the object 190 touches the pressure-sensitive sensor 4 and is seized between the window frame 200 and windowpane 3 as shown in FIG. 8 and FIG. 9, but if the object 190 touches the pressure-sensitive sensor 4 before being seized between the window frame 200 and windowpane 3, the judging unit 31 judges the contact of the object when $|V-V_0|$ is larger than $D_0$, and the controller 39 stops application of voltage $+V_d$ to the motor 8, and applies a voltage $-V_d$ for a specific time to lower the windowpane 3 by a specific extent. Or, if the object 190 touches the windowpane 3 before being seized between the window frame 200 and windowpane 3, the contact judging unit 38 of the opening-closing unit judges the contact of the object with the windowpane 3 if $|\Delta V_w|$ is larger than $V_{w1}$.

The procedure of judging breakage by the abnormality judging unit 32 is explained below. In FIG. 7, the resistance values of the resistor for detecting breakage 24 and the resistor for dividing voltage 29 are supposed to be $R_1$, $R_2$, the voltage at point P to be $V_p$, and the voltage of the power source 42 to be $V_s$. Values of $R_1$ and $R_2$ are usually several megohms to tens of megohms, and since the input impedance of the filter 30 and abnormality judging unit 32 is sufficiently high as compared with $R_1$ and $R_1$, the resistance value of the composite piezoelectric layer 22 is usually more than hundreds of megohms. Therefore, $V_p$ may be regarded as the voltage divided value $V_{12}$ of $R_1$ and $R_2$ with respect to $V_s$. When the central electrode 20 and outside electrode 21 of the piezoelectric sensor 12 are normal, $V_p$ is $V_{12}$. If at least one of the central electrode 20 and outside electrode 21 of the piezoelectric sensor 12 is broken, equivalently point $P_s$ or point $P_b$ in FIG. 7 is open, and $V_p$ is $V_s$. When the central electrode 20 and outside electrode 21 are shorted, equivalently point $P_s$ and point $P_b$ are shorted, so that $V_p$ is equal to the grounding potential. Depending on such changes of $V_p$, the abnormality judging unit 32 detects the value of $V_p$, and judges abnormality due to breakage and shorting of central electrode 20 and outside electrode 21. When abnormality is judged in the abnormality judging unit 32, the judging unit 31 continues to issue Hi as judging signal J.

Figure 11:
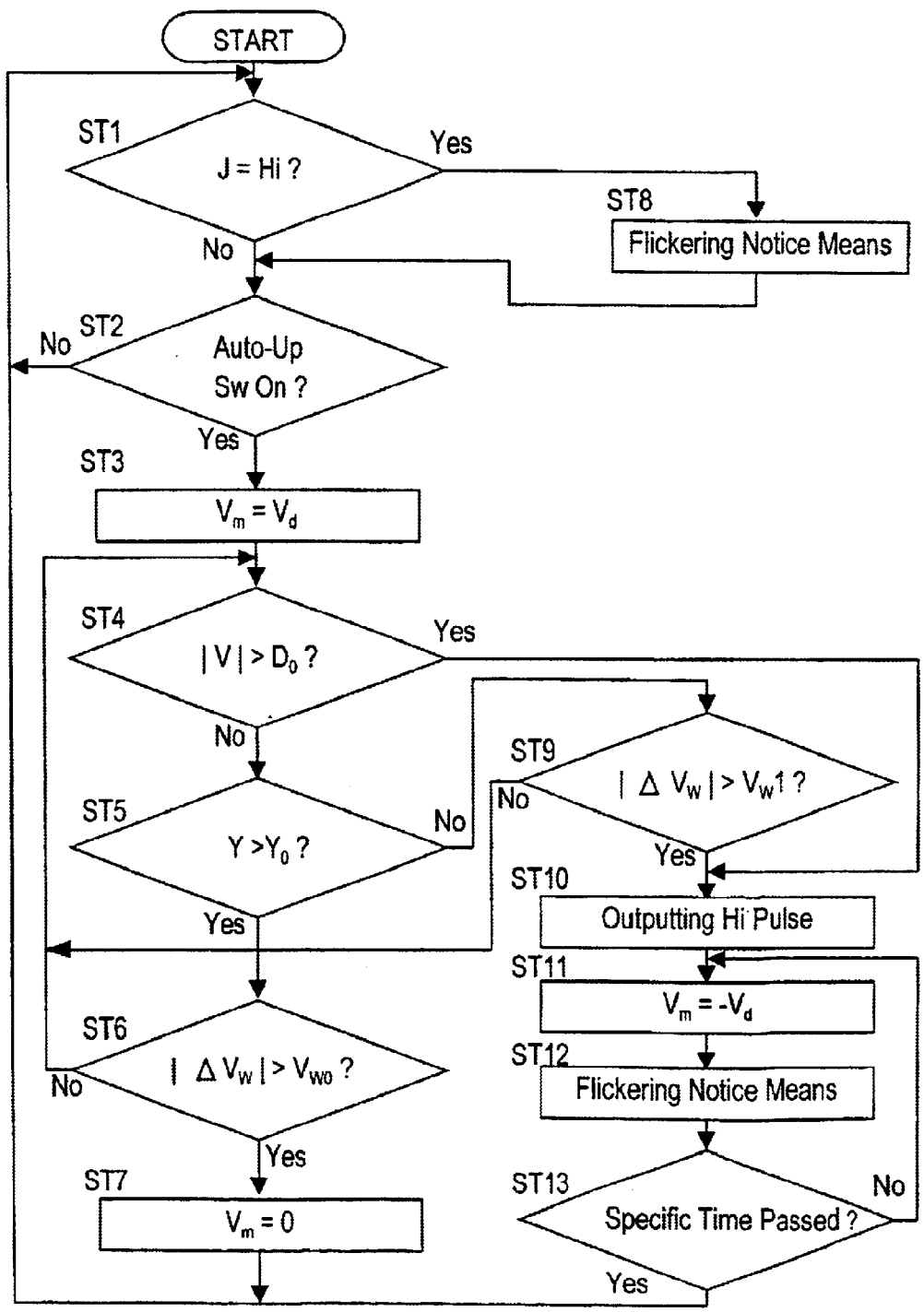
FIG. 11 is a flowchart showing the operating procedure of the device.
Figure 12:
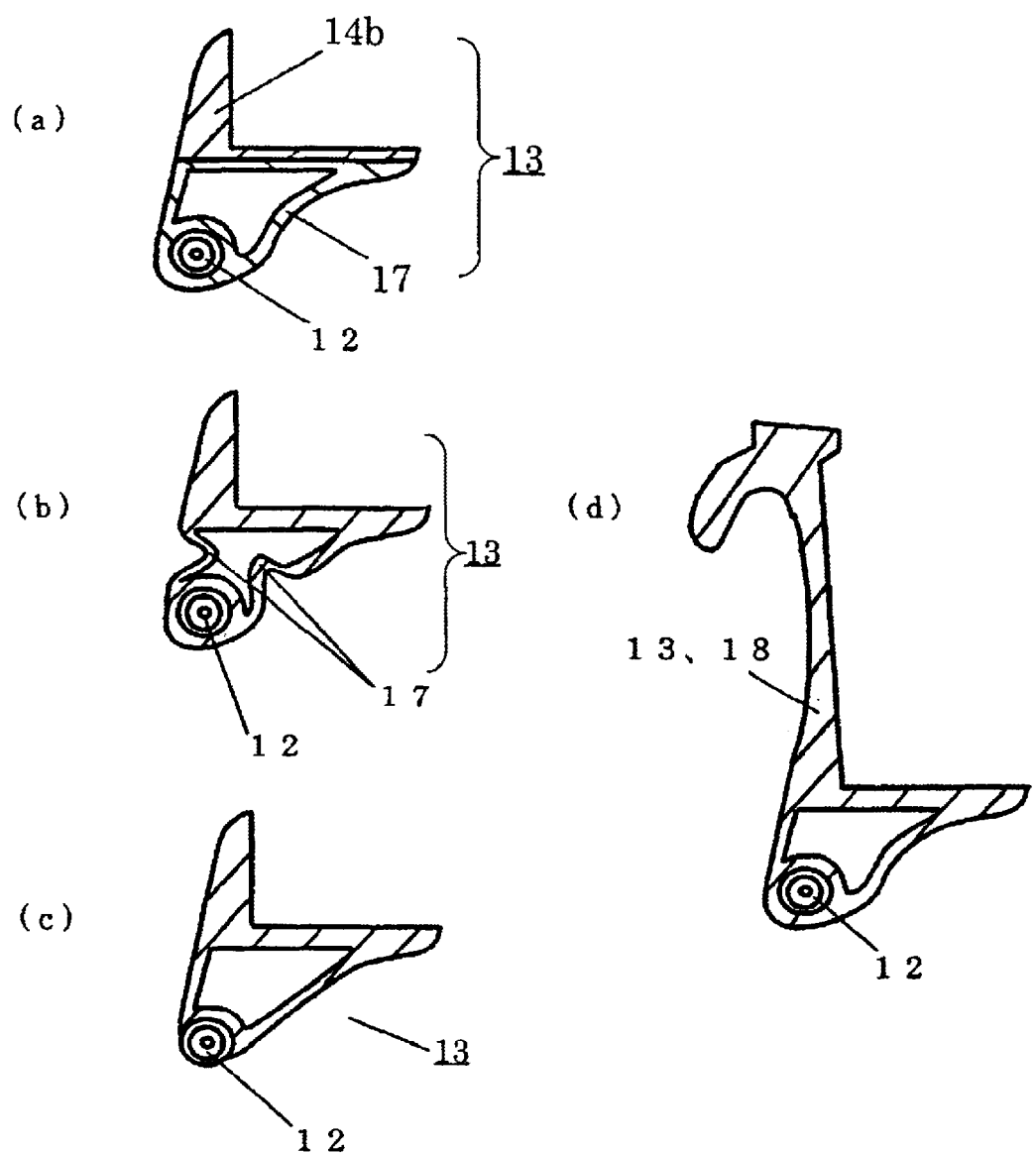
FIG. 12 (a) shows other embodiment of pressure-sensitive sensor of the device.

FIG. 11 is a flowchart showing the operating procedure of the opening-closing device mentioned above. First, when the pressure-sensitive sensor 4 is normal, and no object contacts with the pressure-sensitive sensor 4 or windowpane 3, the operating procedure is as follows. At step ST1, the controller 39 judges if the judging signal J of the judging unit 31 is kept at Hi or not. When the pressure-sensitive sensor 4 is normal, advancing to step ST2, the controller 39 judges if the auto-up switch of the opening-closing switch 41 is turned on or not. If the auto-up switch is not turned on, the process returns to step ST1. When the auto-up switch is turned on, at step ST3, the controller 39 changes the application voltage to the motor 8 $V_m$ to $V_d$, and closes the windowpane 3. At step ST4, the judging unit 31 judges if $|V-V_0|$ is larger than $D_0$ or not, and when no object contacts with the pressure-sensitive sensor 4 or windowpane 3, $|V-V_0|$ is less than $D_0$, and the process advances to step ST5. At step ST5, the controller 39 judges if the upper end position Y of the windowpane 3 detected by the position detector 37 is larger than the specified position $Y_0$ shown in FIG. 1 or not. If Y is larger than $Y_0$, the process advances to step ST6, or if Y is smaller than $Y_0$, the process advances to step ST9. At step ST6, the contact judging unit 38 of the opening-closing unit judges if $|\Delta V_w|$ is larger than the preset value $V_{w0}$ or not. If $|\Delta V_w|$ is larger than $V_{w0}$, it is judged that the windowpane 3 is closed completely, and the process advances to step ST7, and $V_m$ is set to zero to stop the motor 8, thereby terminating the closing action of the windowpane 3. At step ST6, if $|\Delta V_w|$ is smaller than $V_{w0}$, back to step ST4, the closing action of the windowpane 3 is continued. When advancing from step ST5 to step ST9, if no object contacts with the windowpane 3, the contact judging unit 38 of the opening-closing unit judges that $|\Delta V_w|$ is smaller than $V_{w1}$, and back to step ST4, the closing action of the windowpane 3 is continued.

In the event of abnormality, that is, if at least one of the central electrode 20 and outside electrode 21 of the pressure-sensitive sensor 4 is broken or shorted, the operating procedure is as follows. When abnormality occurs in the pressure-sensitive sensor 4 and the abnormality is judged by the abnormality judging unit 32, the judging unit 31 continues to issue Hi as judging signal J, and the process skips from step ST1 to step ST8, and the controller 39 flickers the notice means 40 to inform a third party of occurrence of abnormality in the pressure-sensitive sensor 4, and the process continues from step ST2 and on. In this case, as described later, if the pressure-sensitive sensor 4 is abnormal, presence or absence of contact of an object with the windowpane 3 is detected by the contact judging unit 38 of the opening-closing unit, the seizure of the object can be released.

When the pressure-sensitive sensor 4 is normal and an object contacts with the pressure-sensitive sensor 4 or windowpane 3, the operating procedure is as follows. Since the pressure-sensitive sensor 4 is normal, advancing from step ST1 to step ST2, when the auto-up switch is turned on, the process goes to step ST3, and the controller 39 changes the application voltage to the motor 8 $V_m$ to $V_d$, and closes the windowpane 3. At step ST4, when the object contacts with the pressure-sensitive sensor 4, $|V-V_0|$ becomes larger than $D_0$, and at step ST10, the judging unit 31 issues a pulse signal of Lo→Hi→Lo as judging output. At step ST11 to step ST13, the controller 39 stops application of voltage $+V_d$ to the motor 8, and applies a voltage $-V_d$ for a specific time to lower the windowpane 3 by a specific extent, and flickers the notice means 40 for a specific time to inform a third party of the contact of the object.

At step ST4, when the object does not contact with the pressure-sensitive sensor 4, at step ST5, the position detector 37 judges whether the upper end position Y of the windowpane 3 is higher than $Y_0$ or not, and if Y is higher than $Y_0$, going to step ST6, the closing action of the windowpane 3 is continued. If Y is lower than $Y_0$ at step ST5, going to step ST9, the contact judging unit 38 of the opening-closing unit detects contact. When the object contacts with the windowpane 3, $|\Delta V_w|$ is larger than $V_{W1}$ at step ST9, and hence, at step ST10, the contact judging unit 38 of the opening-closing unit issues a pulse signal of Hi→Hi→Lo as the judging output. At steps ST11, ST12, and ST13, the controller 39 stops application of voltage $+V_d$ to the motor 8, and applies a voltage $-V_d$ for a specific time to lower the windowpane 3 by a specific extent, and flickers the notice means 40 for a specific time to inform a third party of the contact of the object. If $|\Delta V_w|$ is smaller than $V_{w1}$ at step ST9, there is no object contacting with the windowpane 3, and the process goes to step ST4, and the closing action of the windowpane 3 is continued. Meanwhile, since the change of moving speed of the windowpane 3 is greater when the windowpane 3 is fully closed than when an object contacts with the windowpane 3, a value of more than $V_{w1}$ is set as $V_{w0}$. ($V_{W0}$ is the predetermined value when the windowpane 3 is fully closed) In the case of the window frame 200 provided with a side visor, if an object is seized between the side visor and the windowpane 3, the object may not contact with the pressure-sensitive sensor 4. In this embodiment, however, the contact judging unit 38 of the opening-closing unit detects the contact of the object with the windowpane 3, and releases the seizure.

In the event of abnormality occurring in the pressure-sensitive sensor 4, the controller 39 may ban the operation of the auto-up switch of the opening-closing switch 41. In this case, the windowpane 3 can be closed only by the manual switch of the opening-closing switch 41.

Generally, a piezoelectric material has both piezoelectric effect and pyroelectric effect. In this embodiment, if an electric charge is generated in the piezoelectric sensor 13 due to pyroelectric effect by changes of ambient temperature, the resistor for detecting breakage 24 serving also as a discharge unit discharges this electric charge. Therefore, in spite of changes in ambient temperature, undesired noise is not contained in the signal entering the filter 30. In the embodiment, the resistor for detecting breakage 24 is used also as the discharge unit, but an independent discharge unit may be connected between the signal line from the piezoelectric sensor 12 in the judging means 5 and the grounding line.

In the environments of strong electric field at high frequency, the pressure-sensitive sensor 4 may function as a kind of antenna to feed a high frequency signal into the judging means 5, thereby leading to a judging error. In the embodiment, if a high frequency signal invades from the signal input unit 33, the bypass unit 35 passes the high frequency signal to the signal output unit 34, allowing to escape to outside of the judging unit 5, so that undesired noise is not contained in the signal entering into the filter 30. Further, the signal input unit 33 and signal output unit 34 are disposed closely to each other to shorten the bypass route of the high frequency signal, so that the high frequency signal can be passed through easily.

In other embodiment of the pressure-sensitive sensor 4, it may be composed as shown in FIG. 12(a) to (d). FIG. 12(a) to (d) are sectional structural views of the pressure-sensitive sensor 4, and in FIG. 12(a), the support means 13 of the pressure-sensitive sensor 4 includes a side wall 17 made of a more flexible elastic body than the pressure-sensitive means 12, and a stiffer elastic body 14b than the side wall 17. Since the elastic body 14b is stiffer than the side wall 17, when adhering or fixing the pressure-sensitive sensor 4 to the window frame 200, it is easier to adhere because the fixing side is firm.

In FIG. 12(b), the side wall 17 of the support means 13 is bent, and since the side wall 17 is bent, it is easier to deform and easier to damp vibrations.

In FIG. 12(c), the pressure-sensitive means 12 is not incorporated in the support means 13, but a part of the pressure-sensitive means 12 is exposed outside, and supported by the support means 13. By exposing a part of the pressure-sensitive means 12, the object directly contacts with the pressure-sensitive means 12, so that the sensitivity of the pressure-sensitive sensor 4 is enhanced.

Figure 13:
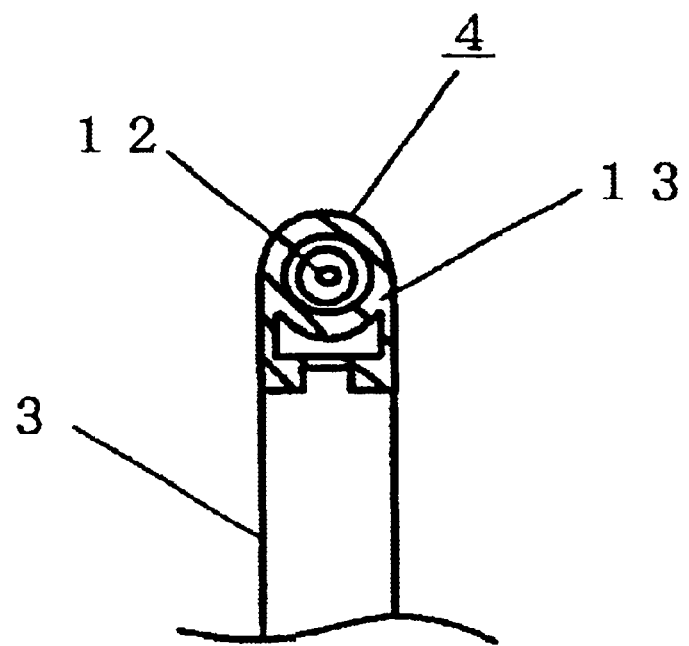
FIG. 13 is a sectional structural view of pressure-sensitive sensor disposed at upper end of windowpane.

In FIG. 12(d), the support means 13 is formed of a part of the weather strip 18 of an automobile, and since the weather strip 18 serves also as the support means 13, the components can be rationalized. In the embodiment, the pressure-sensitive sensor 4 is disposed on the window frame 200, but the pressure-sensitive sensor 4 may be disposed also on the windowpane 3. FIG. 13 is a sectional structural view of the pressure-sensitive sensor 4 disposed on the upper end of the windowpane 3. In this constitution, in the closing action of the windowpane 3, when the object contacts with the upper end of the windowpane 3, the contact of the object is detected by the pressure-sensitive sensor 4, and the closing action of the windowpane 3 is stopped, and the windowpane 3 is opened, so that the seizure can be prevented in advance.

Figure 14:
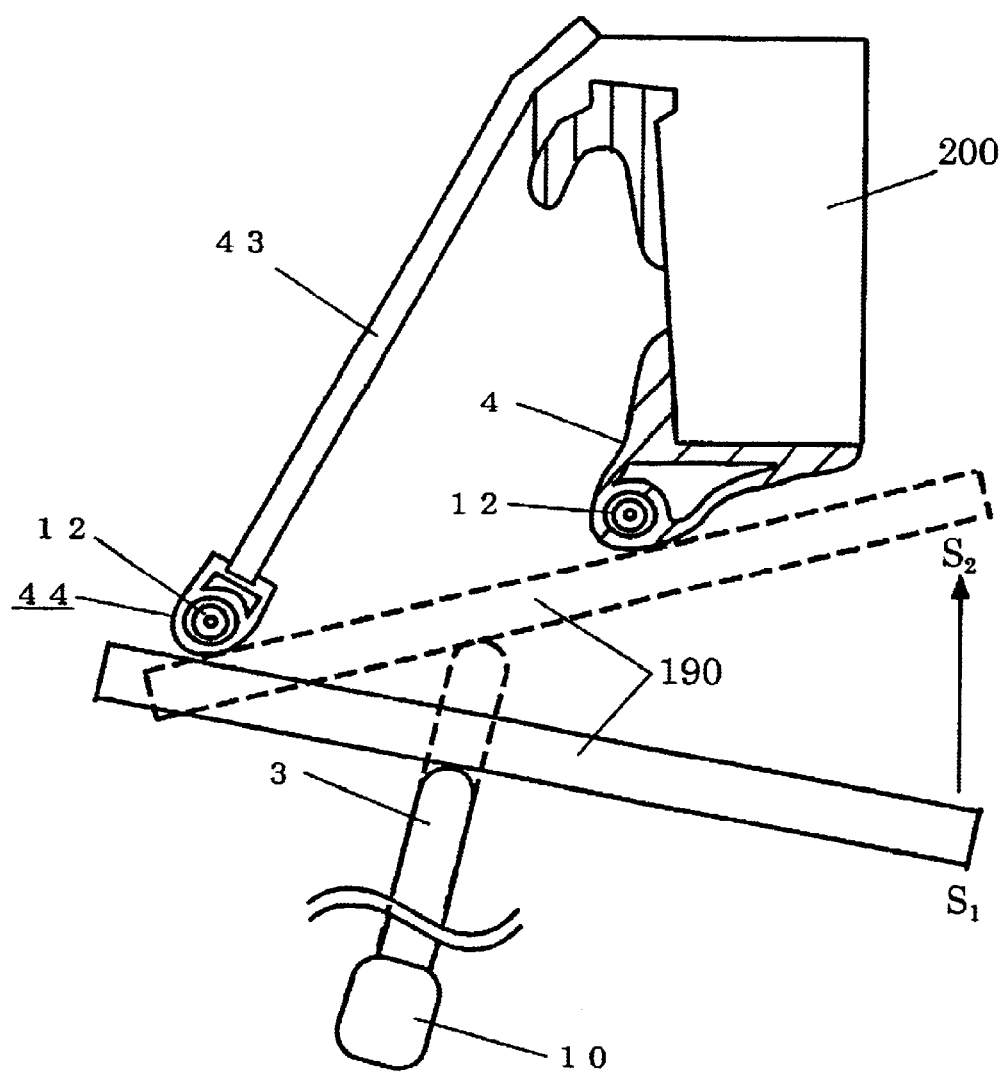
FIG. 14 is a sectional structural view of pressure-sensitive sensor disposed at the edge of side visor.

As shown in FIG. 14, when a side visor 43 is mounted on the window frame 200, a pressure-sensitive sensor 44 may be disposed on the edge of the side visor 43. In this constitution, as shown in FIG. 14, for example, if an object 190 is seized between the side visor 43 and windowpane 3 from the position of $S_1$, the seizure cannot be detected by the pressure-sensitive sensor 4 only unless the object 190 reaches the position of $S_2$, but by using the pressure-sensitive sensor 44, the seizure can be detected while the object 190 is in the position of $S_1$, so that the seizure may be detected earlier and released.

In embodiment 1, the judging result of the judging means 5 is noticed in the notice means 40 made of a specific light or the like incorporated in the front panel in the compartment. Alternatively, the notice means 40 may be realized, for example, by a car horn, or the notice means 40 may be provided with a communication function, and the judging result of the judging means 5 may be noticed at an external communication termination through wireless means or portable telephone circuit.

Embodiment 2

Figure 15:
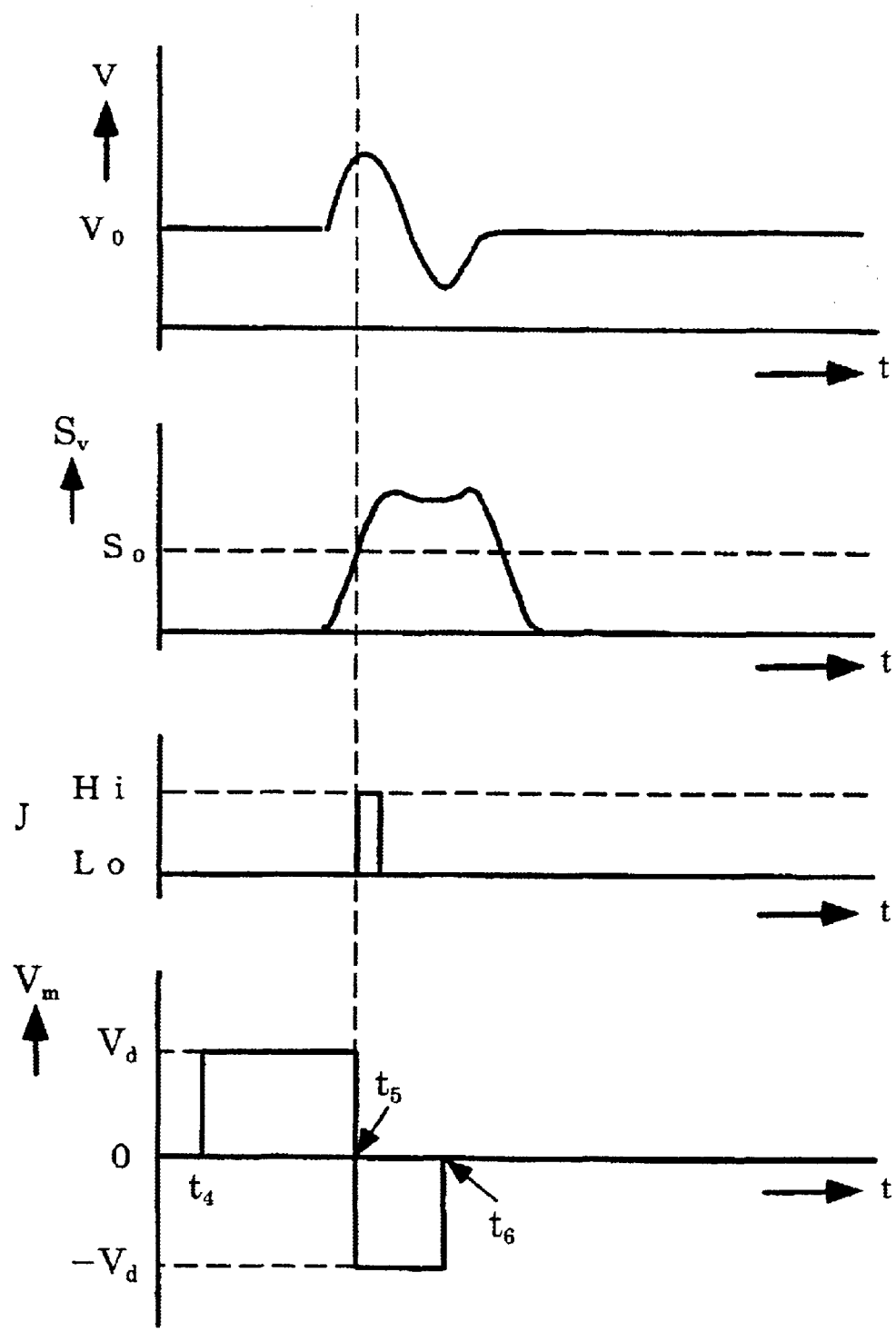
FIG. 15 is a waveform diagram of output signal V from filter of an opening-closing device in embodiment 2, integrated value S, judging output J of judging means, and applied voltage $V_m$ to motor.

Embodiment 2 is explained by referring to FIG. 15. In this embodiment, the judging means 5 calculates the integral value $S_v$ of output signal of the piezoelectric sensor 12 per unit time, and judges the contact of an object on the basis of the integral value.

FIG. 15 is a waveform diagram of this constitution, showing signal V obtained by passing the output of the piezoelectric sensor 12 through the filter 30 and integral value $S_v$, judging output J of the judging means 5, and applied voltage $V_m$ to the motor 8. In FIG. 15, the axis of ordinates denotes V, $S_v$, J, and $V_m$ sequentially from the top, and the axis of abscissas represents the time t. When the auto-up switch of the opening-closing switch 41 is turned on at time $t_4$, the controller 39 applies a voltage $+V_d$ to the motor 8, and closes the windowpane 3. When an object touches the pressure-sensitive sensor 4, the piezoelectric sensor 12 is deformed by the pressure of the object, and an output signal V corresponding to the deformation is generated. At this time, if the object is soft, or the ambient temperature is low and the closing speed of the windowpane 3 is slow, the piezoelectric sensor 12 is deformed slowly, and V in FIG. 15 is smaller in signal level as compared with that in FIG. 10. Accordingly, as shown in FIG. 15, the judging unit 31 calculates the integral value $S_v$ of V per unit time, and issues, at time $t_5$, a pulse signal of Lo→Hi→Lo as a judging output when $S_v$ exceed the predetermined value of $S_0$. Receiving this pulse signal, the controller 39 stops application of voltage $+V_d$ to the motor 8, applies a voltage $-V_d$ for a specific time until time $t_6$ to lower the windowpane 3 by a specific extent, thereby releasing the seizure.

By this action, if the pushing speed of pressure of the object to the pressure-sensitive sensor is slow and the signal level of the output signal of the pressure-sensitive sensor is small, the judging means judges the contact of the object on the basis of the integral value of the output signal of the pressure-sensitive sensor, and therefore if a soft object touches the pressure-sensitive sensor, the contact of the object can be judged securely.

Embodiment 3

Figure 16:
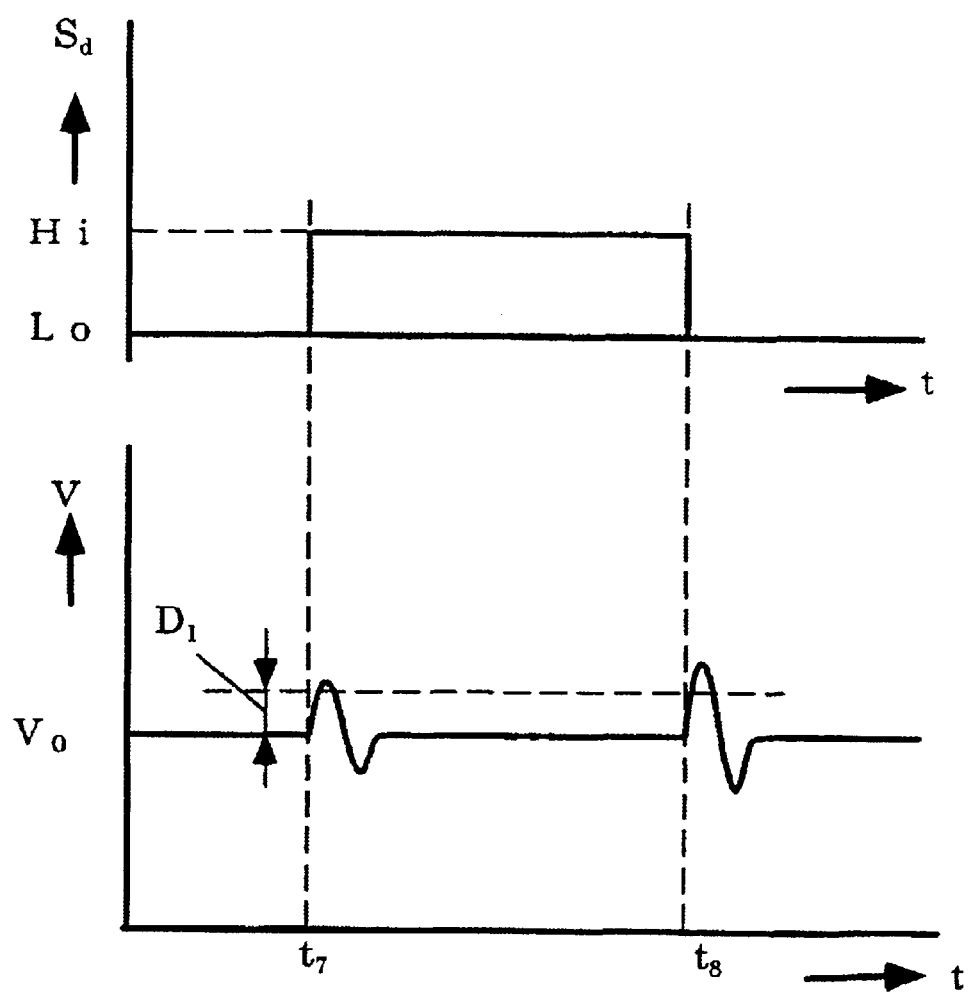
FIG. 16 is a waveform diagram showing the relation of output signal $S_d$ of door opening-closing detecting unit of an opening-closing device in embodiment 3, and output signal V from a filter 30.

Embodiment 3 is explained by referring to FIG. 16. This embodiment is characterized by the function of checking if the function of the pressure-sensitive sensor is normal or not. The door open-closed detector is provided in the door or the body, and a signal of Hi is issued when the door is open, and a signal of Lo is given when the door is closed. When an open or closed door is detected, the abnormality judging unit 32 judges abnormality of the pressure-sensitive sensor 4 on the basis of the output signal of the pressure-sensitive sensor 4 corresponding to the vibration on the window frame 200 due to opening or closing of the door.

FIG. 16 is a waveform diagram of this constitution, showing the relation between the output signal $S_d$ of the door open-closed detector, and output signal V from the filter 30. In FIG. 16, the axis of ordinates denotes $S_d$ and V sequentially from the top, and the axis of abscissas represents the time t.

When the door is opened at time $t_7$, $S_d$ is changed from Lo to Hi, and the car body vibration when the door is opened is propagated from the window frame 200 to the pressure-sensitive sensor 4, and the pressure-sensitive sensor 4 issues an output by the car body vibration, and V shows the waveform as shown in FIG. 16. When the door is closed at time $t_8$, $S_d$ is changed from Hi to Lo, and the car body vibration when the door is closed is propagated to the pressure-sensitive sensor 4, and the pressure-sensitive sensor 4 issues an output by the car body vibration, and an output as shown in FIG. 16 appears at V. Every time the output signal of the door open-closed detector changes from Lo to Hi, or from Hi to Lo, the abnormality judging unit 32 judges there is no function abnormality when the amplitude |V| of the output V at this time is larger than a predetermined value $D_1$, and judges that the sensitivity of the pressure-sensitive sensor 4 is lowered to be abnormal in function when V is smaller than $D_1$. When the abnormality is judged, as same as in embodiment 1, the judging signal J of the judging unit 31 is continuously Hi, and the contact of the object is judged by the contact judging unit 38 of the opening-closing unit only.

By this action, function abnormality of the pressure-sensitive sensor is judged, and the reliability of the device is enhanced.

Embodiment 4

Figure 17:
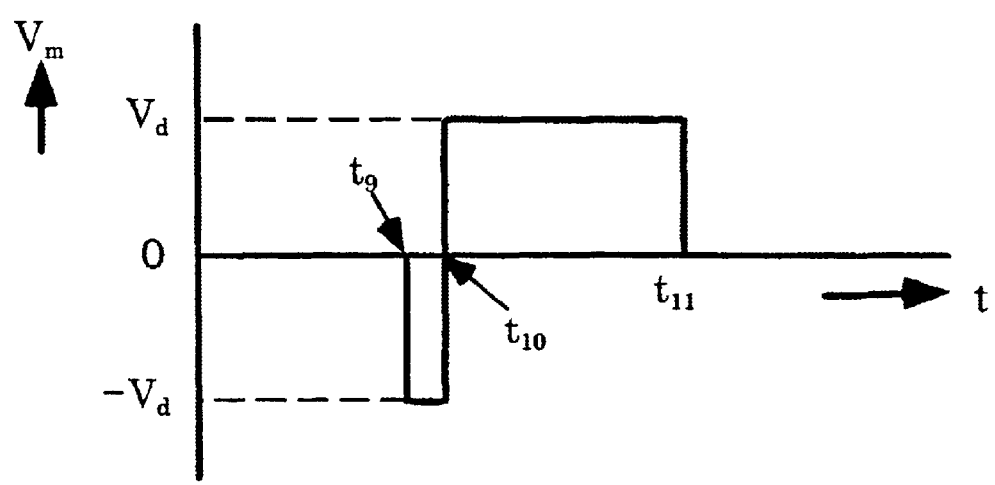
FIG. 17 is a waveform diagram of applied voltage $V_m$ to drive means in an opening-closing device in embodiment 4.

Embodiment 4 is explained by referring to FIG. 17. In this embodiment, the control means 7 controls the drive means 6, when closing the windowpane 3, so as to close after once moving the windowpane 3 in the opening direction by a specific distance, or opening for a specific time.

FIG. 17 is a waveform diagram showing the applied voltage $V_m$ to the drive means 6 in this constitution. In the diagram, the axis of ordinates denotes $V_m$, and the axis of abscissas represents the time t. In FIG. 17, when closing the windowpane 3, by turning on the auto-up switch at time $t_s$, the controller 39 sets the applied voltage $V_m$ to the motor 8 at $-V_d$ until time $t_{10}$ to move the windowpane 3 by a small distance in the opening direction, and sets $V_m$ at $+V_d$ after time $t_{10}$ until closed completely at time $t_{11}$ to close the windowpane 3. Time setting from time $t_9$ to $t_{10}$ may be optimized depending on the weight of the opening-closing unit 3 and capacity of the motor 8, and it may be at least about hundreds of milliseconds.

For example, before closing the windowpane 3, if an object has been already seized between the window frame 200 and windowpane 3, it is assumed that the pressure-sensitive sensor 4 is in a state unable to be deformed. In such a case, too, when closing the windowpane 3, by closing after once moving the windowpane 3 in the opening direction by a specific distance, or opening for a specific time, the deformation of the pressure-sensitive sensor 4 is once restored, and then the pressure-sensitive sensor 4 is deformed by the pressure of the object by the closing action of the windowpane 3. Accordingly, an output signal depending on the pressure is issued from the pressure-sensitive sensor 4, and the contact of the object is judged, so that undesired the seizure of the object between the window frame 200 and windowpane 3 is prevented.

Embodiment 5

Embodiment 5 is explained by referring to FIG. 18 to FIG. 22.

Figure 18:
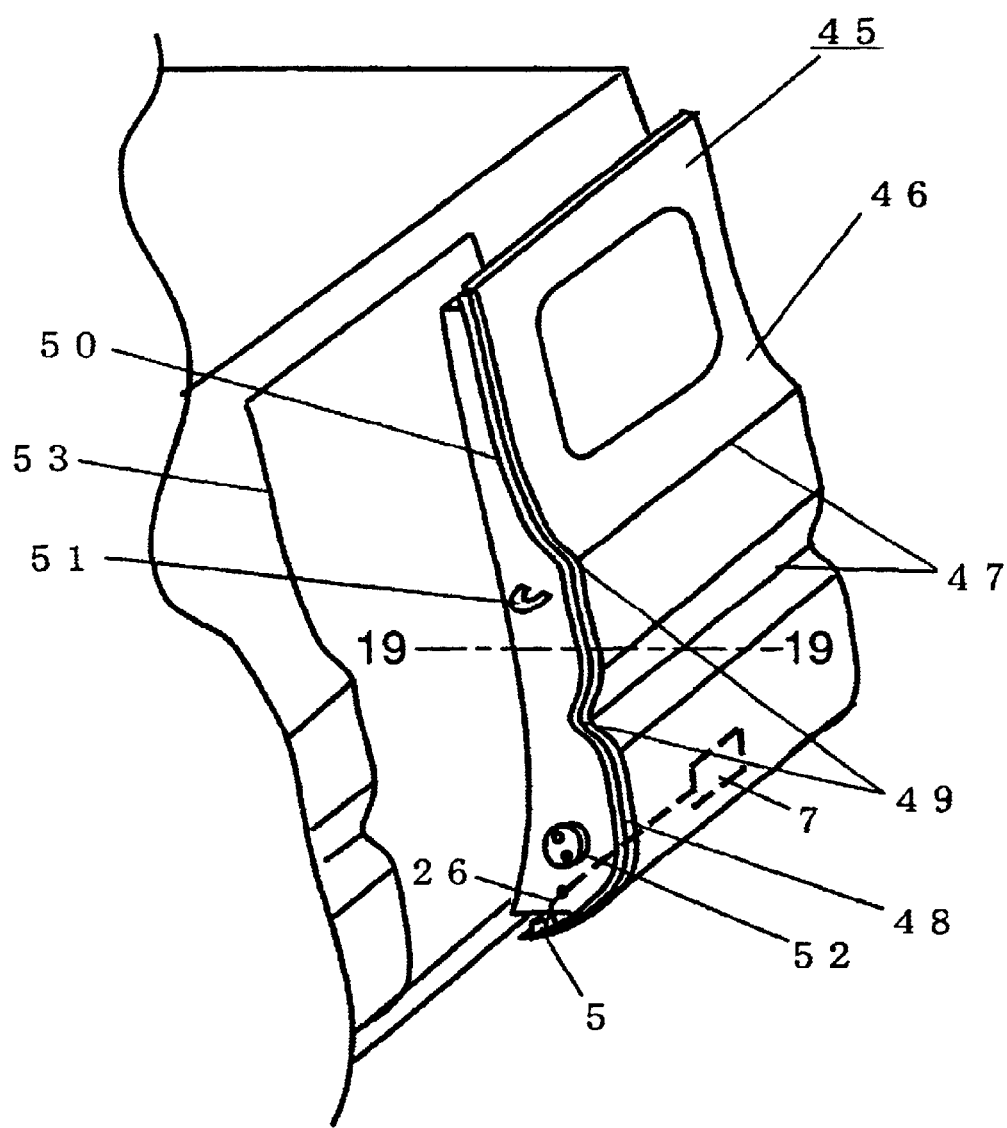
FIG. 18 is an appearance view of an object detecting device and opening-closing device in embodiment 5.
Figure 19:
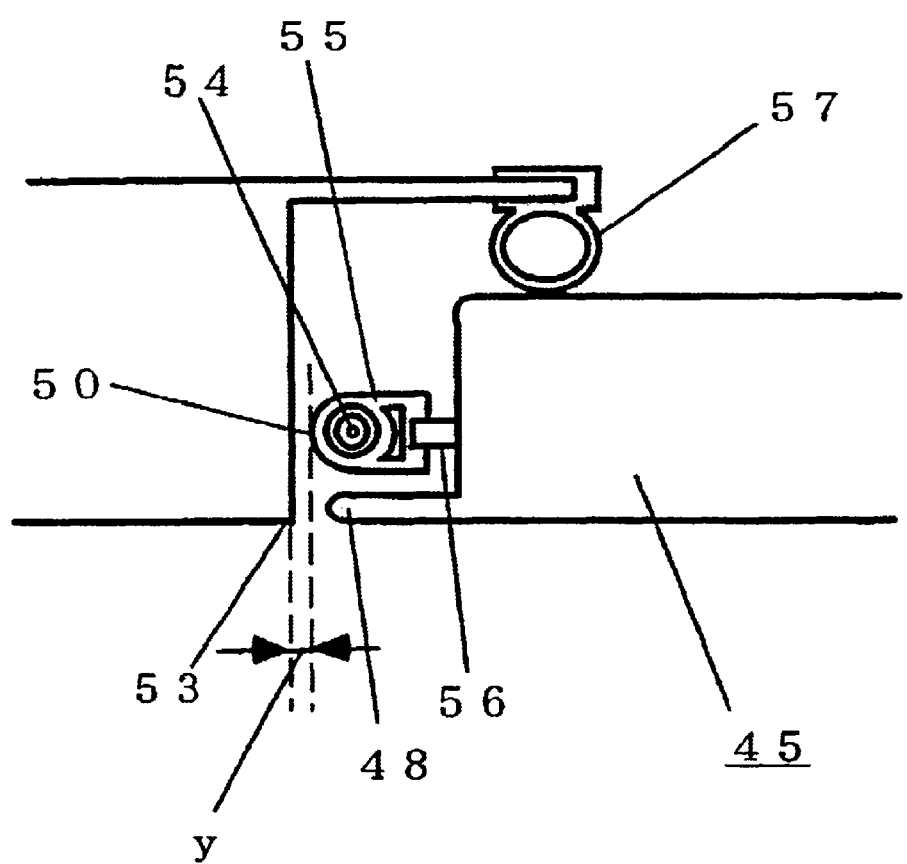
FIG. 19 is a sectional view at position 19—19 in FIG. 18.

FIG. 18 is an appearance view of an object detecting device and opening-closing device in embodiment 5, showing a case of application in a power slide door of an automobile. FIG. 19 is a sectional structural view at position 19—19 in FIG. 18. The opening-closing device of the embodiment comprises a slide door 45, a door panel 46 of the slide door, an undulated portion 47, a vertical edge 48 of the slide door 45, a bent portion 49 of the vertical edge 48, a pressure-sensitive sensor 50, a door lock 51, an electrode 52 for detecting opening or closing of the slide door 45, and a body opening 53 for access of the driver and passengers by opening the slide door 45. Further, FIG. 19 shows a piezoelectric sensor 54, support means 55 for supporting the piezoelectric sensor 54, a fixing portion 56 for fixing the piezoelectric sensor 50 to the slide door 45, and a seal portion 57 for sealing between the body opening 53 and slide door 45 when the slide door 45 is closed.

Preferably, the pressure-sensitive sensor 50 is disposed at the body opening 53 side of the slide door 45, and placed at the terrace of the vertical edge 48 provided closely to the inside of the compartment. Such terrace is usually provided for disposing a down-stopper in the slide door 45, and a slide door having such terrace is disclosed, for example, in Japanese Laid-open Patent No. 62-137716. The pressure-sensitive sensor 50 is, as shown in FIG. 19, fixed in the fixing portion 66 at specific distance y from the body opening 53 so as not to contact with the body opening 53 when the slide door 45 is closed completely. Considering possibility of the seizure of a finger of a child or the like, the distance y is preferably 3 mm to 5 mm. Also, for the ease of detection of contact of an object with the slide door 45, the pressure-sensitive sensor 50 is disposed so that a part of the pressure-sensitive sensor 50 may bulge out to the body opening 53 side from the vertical edge 48. Or the pressure-sensitive sensor 50 may be disposed at the vertical edge 48. The control means 7 is disposed in the slide door 45. To detect the contact of an object near the vertical edge 48 of the slide door 45 in a wide range as far as possible, as disclosed, for example, in Japanese Utility Model Publication No. 38-2015, the judging means 5 for issuing a judging signal to the control means 7 is disposed in the lowest position of the pressure-sensitive sensor 50. The judging means 5 is fixed near the lowest position of the vertical edge 48 of the slide door 45. Or, as disclosed in Japanese Laid-open Patent No. 8-232525 or Japanese Laid-open Patent No. 9-96146, when the motor or the control unit of the motor is disposed in the slide door 45, it is general to be disposed at the lower side from the lower end of the windowpane, avoiding the windowpane of the slide door 45. Therefore, in this embodiment, too, the control means 7 is disposed at the lower side from the lower end of the windowpane of the slide door 45, and hence, as a matter of course, the judging signal from the judging means 5 is transmitted to the control means 7 through the cable 26 by way of the penetration hole provided at the lower side from the lower end of the windowpane, preferably near the judging means 5. Such penetration hole is quite general, as being disposed when transmitting signal from outside to inside of the slide door 45 as in the case of disposing, for example, the electrode 52 for detecting opening and closing in the slide door 45. The drive means of the slide door 45 is realized by any one of the general structures using motors or the like.

Figure 20:
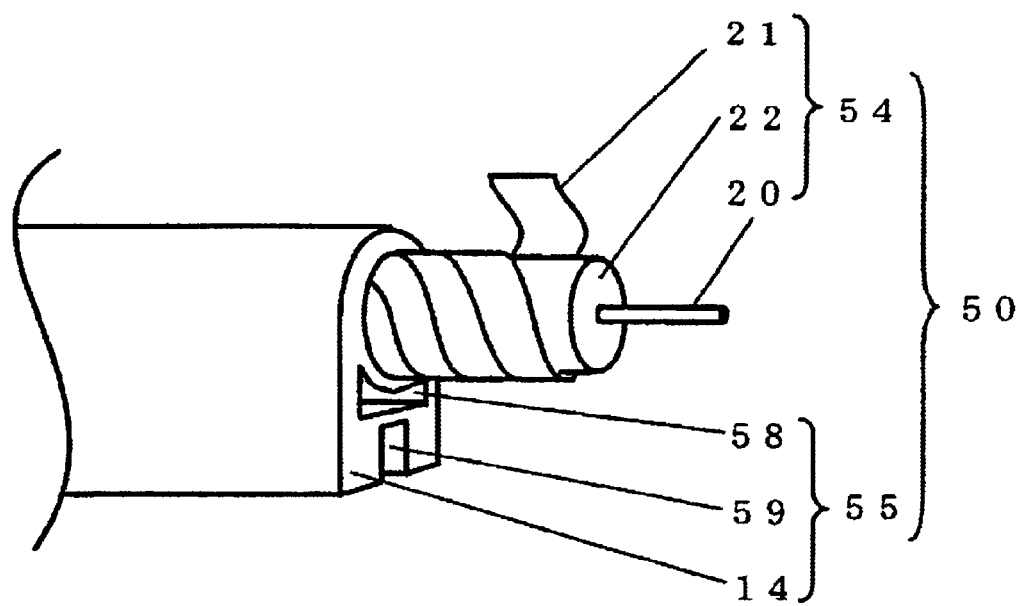
FIG. 20 is a structural diagram of pressure-sensitive sensor of the device.

FIG. 20 is a structural diagram of the pressure-sensitive sensor 50. The pressure-sensitive sensor 50 is composed of a piezoelectric sensor 54 as pressure-sensitive means, support means 55, and others. The piezoelectric sensor 54 is formed by laminating the central electrode 20, outside electrode 21, and composite piezoelectric layer 22 as piezoelectric material, concentrically, and is flexible in a form of coaxial cable. The support means 55 incorporates the piezoelectric sensor 54, and has a more flexible elastic body 14 than the piezoelectric sensor 54, a hollow portion 58, and a groove 59 for fixing to the fixing portion 56. In the piezoelectric sensor 12 in embodiment 1, a covering layer 23 is disposed in the outermost layer, but in the piezoelectric sensor 54 of this embodiment, the support means 55 also serves as the covering layer, so that the components are rationalized.

The opening-closing device of the embodiment can also detect contact of the object with the pressure-sensitive sensor 50 in the same procedure as in embodiment 1, and is also capable of preventing undesired seizure of an object, or reducing the load applied to the object until the seizure is released if the object is seized.

Or, as shown in FIG. 18, in the embodiment, to prevent the seizure of an object between the slide door 45 and the body opening 53, the pressure-sensitive sensor 50 having the flexible piezoelectric sensor 54 is disposed so as to be bent along the shape of the slide door 45. The door panel 46 is provided with the undulated portion 47 for reinforcing the rigidity or from the viewpoint of styling, and if there is a bent part 49 at the vertical edge 48, the pressure-sensitive sensor of the embodiment does not cause detecting errors due to erroneous contact of the pressure-sensitive switch in the bent part 49 as in the conventional pressure-sensitive switch of contact type. Therefore, the degree of freedom is enhanced in the aspect of reinforcement of rigidity or styling of the door panel 46.

Since the conventional pressure-sensitive switch of contact type cannot be bent, meanwhile, when disposing on the slide door 45, an undesired gap is formed between the pressure-sensitive switch and vertical edge 48. Accordingly, if an object is seized between this gap and the body opening 53, since the object does not touch the pressure-sensitive switch, and the seizure cannot be detected. In this embodiment, on the other hand, since the gap is small between the vertical edge 48 and pressure-sensitive sensor 50, if an object is seized between the slide door 45 and body opening 53, the object easily touches the pressure-sensitive sensor 50, and the seizure can be detected.

If the slide door 45 is provided with accessories such as door lock 51 and electrode 52 for detecting opening and closing 52, the pressure-sensitive sensor 50 can be bent and disposed by evading these accessories. As a result, there is no restriction about location of accessories.

Figure 21:
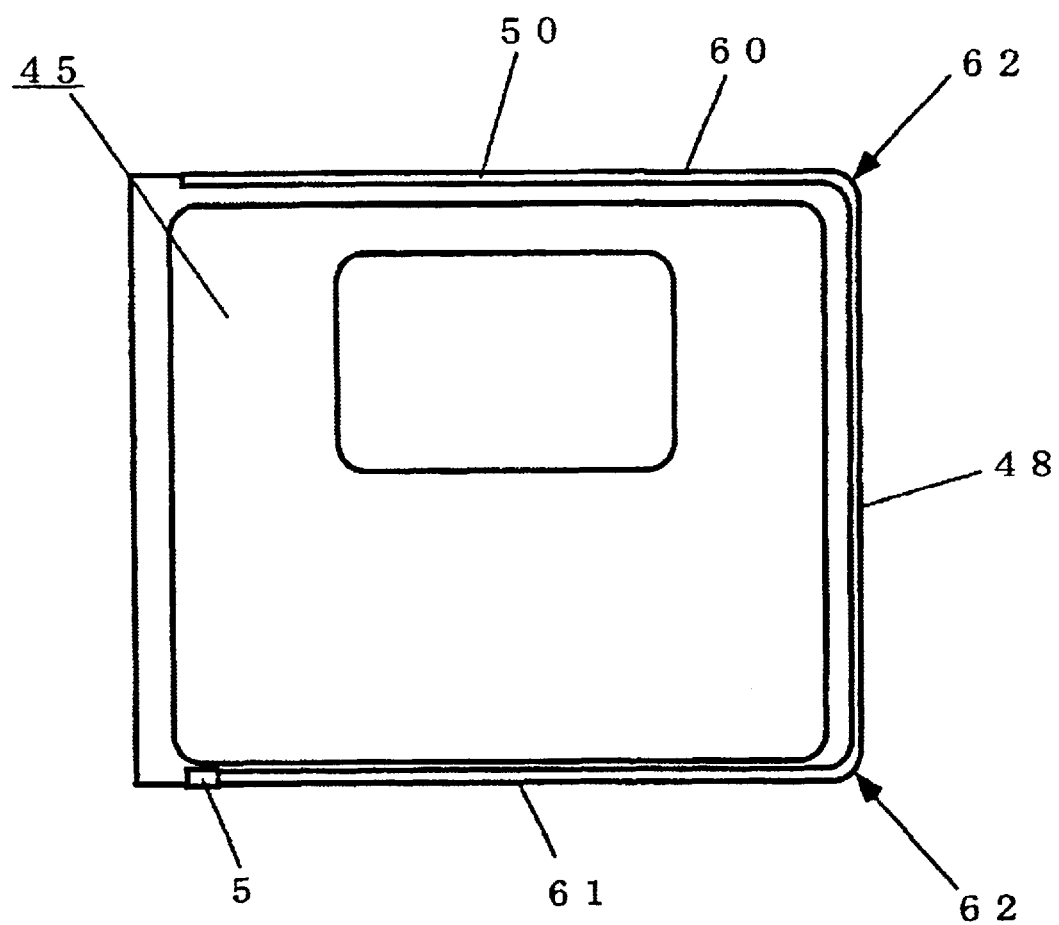
FIG. 21 is an appearance view of other embodiment of pressure-sensitive sensor of the device disposed at a slide door.
Figure 22:
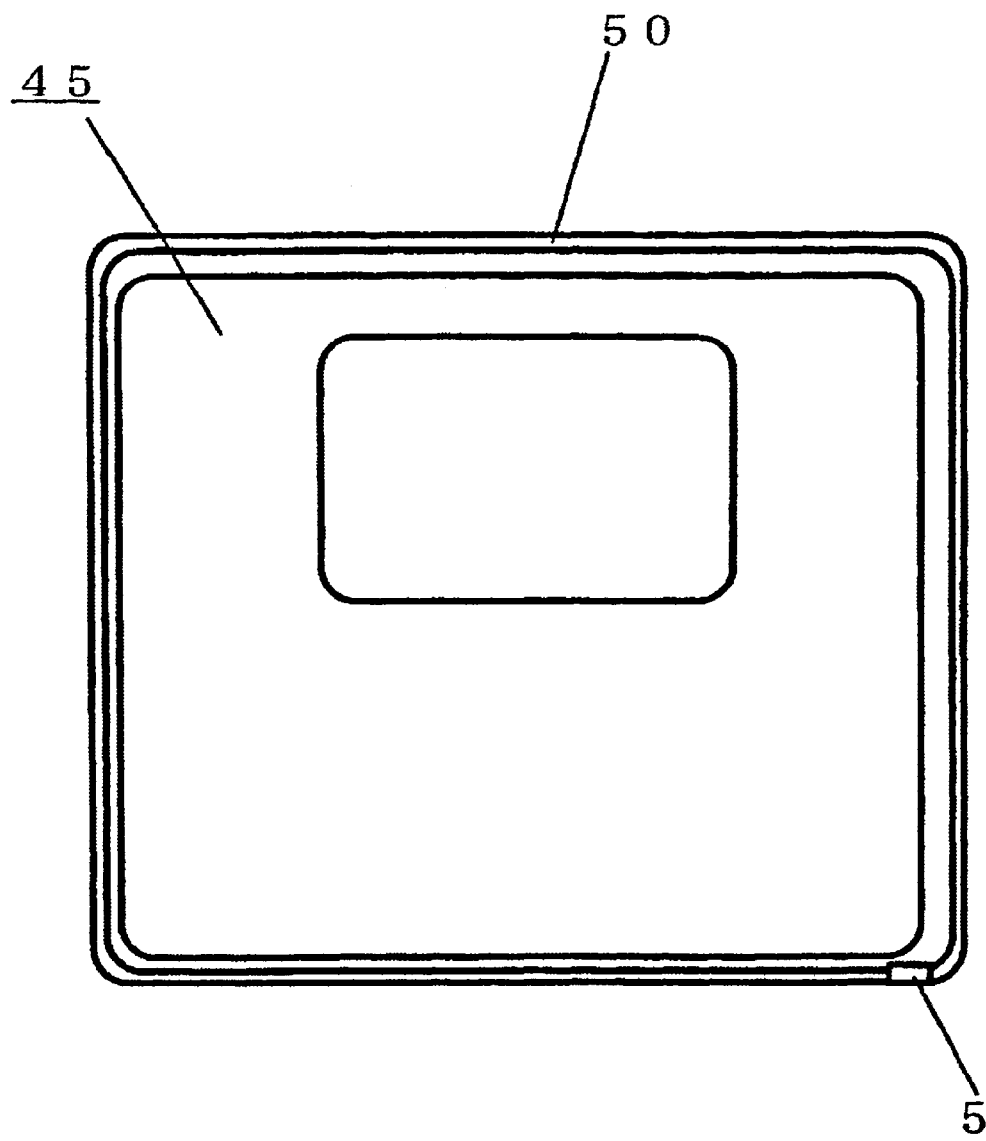
FIG. 22 is an appearance view of other embodiment of pressure-sensitive sensor of the device disposed at a slide door.

In other embodiment of a constitution of disposing the pressure-sensitive sensor 50 in the slide door 45, the pressure-sensitive sensor 50 may be disposed as shown in FIG. 21 and FIG. 22. In FIG. 21, the pressure-sensitive sensor 60 is disposed at the vertical edge 48, the upper edge 60, and the lower edge 61. In this constitution, the seizure of an object between the vertical edge 48 of the slide door 45 and the body opening 53 (FIG. 18) can be detected, and further the seizure of an object between the upper edge 60, lower edge 61, and body opening 53 can be detected, so that the seizure detecting range is expanded. Although the pressure-sensitive sensor 50 must be bent at a corner 62 of the slide door 45, since the flexible piezoelectric sensor 54 is used, if bent, unlike the conventional pressure-sensitive switch, detection errors do not occur.

In FIG. 22, the pressure-sensitive sensor 50 is disposed along the entire periphery of the edge of the slide door 45, and both ends of the pressure-sensitive sensor 50 are connected to the judging means 5. In this constitution, the seizure of an object between the entire periphery of the edge of the slide door 45 and the body opening 53 (FIG. 18) can be detected, and the seizure detecting range is further expanded as compared with the constitution in FIG. 18 or FIG. 21.

In the constitution in FIG. 22, since the both ends of the pressure-sensitive sensor 50 are connected to the judging means 5, the signals can be detected from both ends of the piezoelectric sensor 54 by the judging means 5. In this case, if the central electrode 20 or outside electrode 21 of the piezoelectric sensor 54 is broken on the way, since the detection signal can be obtained from either end of the piezoelectric sensor 54, the reliability is enhanced. Further, as in another case, one end of the outside electrode 21 is connected to the ground, the other end is connected to the power source through a resistance, and the voltage at the contact point of the outside electrode 21 side of the resistance is detected by the abnormality judging unit 32. In this constitution, if the outside electrode 21 is normal, the voltage at the point is the grounding potential, and when the outside electrode 21 is broken, the voltage of the point is the power source voltage, so that breakage of the outside electrode 21 can be detected, and the reliability is further enhanced.

Embodiment 6

Figure 23:
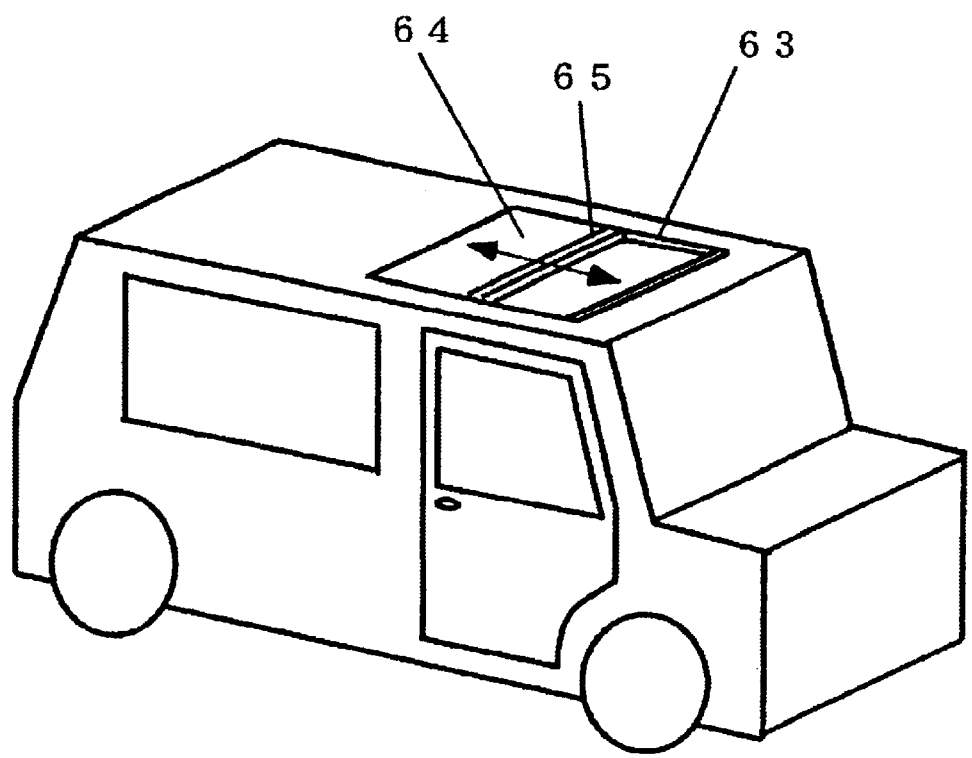
FIG. 23 is an appearance view of embodiment 6.

In this embodiment shown in FIG. 23, the invention is applied in a motor-driven sunroof 63 of an automobile, and a pressure-sensitive sensor 65 is disposed in a windowpane 64 of the motor-driven sunroof 63. In this constitution, the seizure of an object in the motor-driven sunroof 63 is prevented.

Embodiment 7

Figure 24:
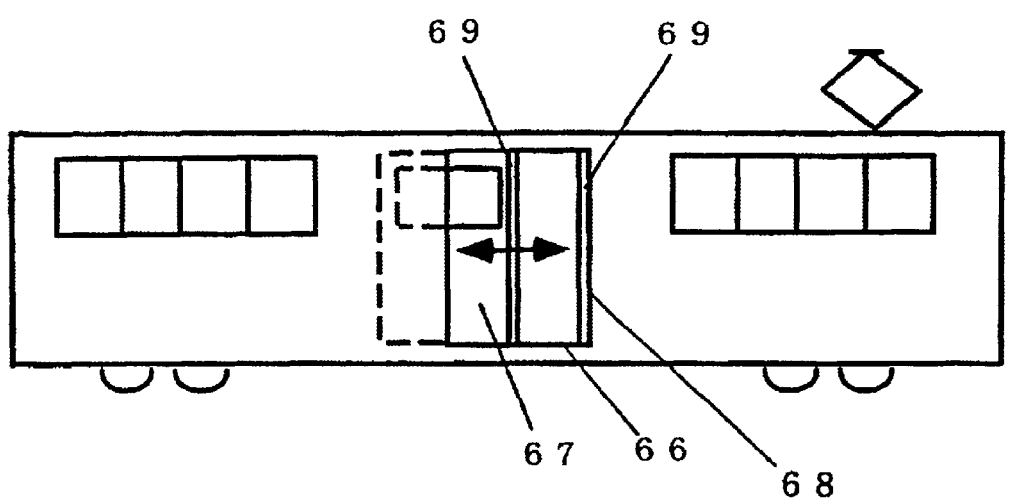
FIG. 24 is an appearance view of embodiment 7.

This embodiment shown in FIG. 24 is an application of the invention in an automated door 66 of a train, and a pressure-sensitive sensor 69 is disposed in a door 67 or a door opening 68 of the automated door 66. In this constitution, the seizure of an object in the automated door 66 can be prevented.

In the foregoing embodiments 1 to 7, the flexible piezoelectric sensor in cable form is used as the pressure-sensitive means, but a flexible piezoelectric sensor of band or sheet form may be also used. Instead of the piezoelectric sensor, moreover, pressure-sensitive means of a type of detecting an electrostatic capacity between electrodes, pressure-sensitive means of a type of varying in electric conductivity due to pressure, or other pressure-sensitive means may be used.

INDUSTRIAL APPLICABILITY

The invention relates to a pressure-sensitive sensor, an object detecting device, and an opening-closing device used for preventing the seizure of an object in a power window, motor-driven slide door and motor-driven sunroof of an automobile, an automated door of a building, and the like. In these devices, hitherto, there were problems, such as failure in releasing the seizure and damage of the object due to increase of the load applied to the object until the seizure is released. The invention presents the pressure-sensitive sensor large in output and excellent in flexibility, the object contact detecting device of high reliability, and the opening-closing device not damaging the object when the object is seized.

What is claimed is:

1. A pressure-sensitive sensor disposed at at least one of an opening and an opening-closing unit for opening and closing said opening, used for detecting contact of an object and preventing seizure of the object between said opening and said opening-closing unit, said pressure-sensitive sensor comprising:
pressure-sensitive means for generating an output signal depending on deformation; and
support means for supporting said pressure-sensitive means in at least one of said opening and said opening-closing unit,
wherein said support means has a greater flexibility than said pressure-sensitive means.

2. The pressure-sensitive sensor of claim 1,
wherein said support means includes:
a deformation amplifying portion for amplifying the deformation of said pressure-sensitive means.

3. The pressure-sensitive sensor of claim 2,
wherein said deformation amplifying portion includes:
a hollow portion.

4. The pressure-sensitive sensor of claim 1,
wherein said support means includes;
a vibration damping portion for damping vibration.

5. The pressure-sensitive sensor of claim 4,
wherein said support means includes:
a deformation amplifying portion for amplifying the deformation of said pressure-sensitive means,
said vibration damping portion serves also as said deformation amplifying portion.

6. The pressure-sensitive sensor of claim 1,
wherein said support means is formed of a part of a weather strip of an automobile.

7. The pressure-sensitive sensor of claim 1,
wherein said pressure-sensitive sensor can be disposed in aid opening so that the shortest distance from said opening-closing unit may be in a range of 3 mm to 5 mm.

8. The pressure-sensitive sensor of claim 1, further comprising:

plural electrodes for leading out signals; and
a resistor for detecting breakage disposed between said electrodes for detecting breakage of said electrodes.

9. The pressure-sensitive sensor of claim 1,
wherein said pressure-sensitive means is composed of a flexible piezoelectric sensor, and
said support means flexibly supports said piezoelectric sensor along a shape of edge of said opening or said opening-closing unit.

10. The pressure-sensitive sensor of claim 9,
wherein said piezoelectric sensor is molded by using a composite piezoelectric material mixing amorphous chlorinated polyethylene, crystalline chlorinated polyethylene, and piezoelectric ceramic powder.

11. An object detecting device for detecting a contact of an object, and preventing a seizure of the object between an opening and an opening-closing unit for opening and closing said opening, said object detecting device comprising:
a pressure-sensitive sensor disposed at at least one of said opening and said opening-closing unit, said pressure-sensitive sensor comprising:
pressure-sensitive means for generating an output signal depending on deformation; and
support means for supporting said pressure-sensitive means in at least one of said opening and said opening-closing unit, said support means having a greater flexibility than said pressure-sensitive means; and
judging means for judging the contact of the object with said pressure-sensitive sensor on the basis of an output signal of said pressure-sensitive sensor.

12. The object detecting device of claim 11, further comprising:
notice means for informing a third party of a judging result of said judging means.

13. The object detecting device of claim 11,
wherein said pressure-sensitive sensor is connected directly to said judging means, and said pressure-sensitive sensor and said judging means are integrated.

14. The object detecting device of claim 11,
wherein said judging means includes:
a filter for extracting only a specified frequency component from the output signal of said pressure-sensitive sensor.

15. The object detecting device of claim 11,
wherein said judging means calculates an integral value of the output signal of said pressure-sensitive means per unit time, and judges the contact of the object with said pressure-sensitive sensor on the basis of the integral value.

16. The object detecting device of claim 11,
wherein said judging means includes:
an abnormality judging unit for judging abnormality of said pressure-sensitive means on the basis of the output signal of said pressure-sensitive means corresponding to vibration of said opening or said opening-closing unit.

17. The object detecting device of claim 11,
wherein said judging means includes:
a signal input unit for feeding the output signal of said pressure-sensitive means;
a signal output unit for issuing a judging result of judging the contact of the object to said pressure-sensitive sensor; and
a bypass unit for passing high frequency signal through between said signal input unit and said signal output unit.

18. The object detecting device of claim 17,
wherein said signal input unit and signal output unit are disposed closely to each other so as to shorten a bypass route of high frequency signal.

19. An object detecting device for detecting a contact of an object, and preventing a seizure of the object between an opening and an opening-closing unit for opening and closing said opening, said object detecting device comprising:
a pressure-sensitive sensor disposed at at least one of said opening and said opening-closing unit, said pressure-sensitive sensor comprising:
pressure-sensitive means for generating an output signal depending on deformation, said press sensitive means being composed of a flexible piezoelectric sensor; and
support means for supporting said pressure-sensitive means along a shape of an edge of said opening or said opening-closing unit, said support means having a greater flexibility than said pressure sensitive means;
judging means for judging the contact of the object with said pressure-sensitive sensor on the basis of an output signal of said pressure-sensitive sensor; and
a discharge unit for discharging an electric charge generated in said piezoelectric sensor disposed in at least one of said piezoelectric sensor and said judging means.

20. An opening-closing device having a function for detecting a contact of an object, and preventing a seizure of the object between an opening and an opening-losing unit for opening and closing said opening, said opening-closing device comprising:
an object detecting device comprising:
a pressure-sensitive sensor disposed at at least one of said opening and said opening-closing unit, said pressure-sensitive sensor comprising:
pressure-sensitive means for generating an output signal depending on deformation; and
support means for supporting said pressure-sensitive means in at least one of said opening and said opening-closing unit, said support means having a greater flexibility than said pressure-sensitive means; and
judging means for judging the contact of the object with said pressure-sensitive sensor on the basis of an output signal of said pressure-sensitive sensor;
drive means for driving said opening-closing unit; and
control means for controlling said drive means so as to stop closing action of said opening-closing unit or open said opening-closing unit when said judging means judges the contact of the object with said pressure-sensitive sensor when said opening-closing unit is closing.

21. The opening-closing device of claim 20,
wherein said control means includes:
a contact judging unit of said opening-closing unit for judging the contact of the object with said open-closing unit on the basis of a detected drive state when said contact judging unit detects the drive state when said drive means drives said opening-closing unit; and
a controller for controlling said drive means on the basis of an output signal from at least one of said object detecting device and said contact judging unit.

22. The opening-closing device of claim 21,
wherein said control means controls said drive means on the basis of an output signal of said contact judging unit if abnormality occurs in said object detecting device.

23. The opening-closing device of claim 20,
wherein said control means controls said drive means so as to close after once moving said opening-closing unit by a specific distance in opening direction or opening for a specific time when closing said opening-closing unit.

24. An opening-closing device having a function for detecting a contact of an object, and preventing a seizure of the object between an opening and an opening-closing unit for opening and closing said opening, said opening-closing device comprising:

an object detecting device comprising:
  a pressure-sensitive sensor disposed at at least one of said opening and said opening-closing unit, said pressure-sensitive sensor comprising:
    pressure-sensitive means for generating an output signal depending on deformation, said pressure-sensitive means a being composed of a flexible piezoelectric sensor; and
    support means for supporting said pressure-sensitive means along a shape of an edge of said opening or said opening-closing unit, said support means having a greater flexibility than said pressure-sensitive means;
  judging means for judging the contact of the object with said pressure-sensitive sensor on the basis of an output signal of said pressure-sensitive sensor; and
  a discharge unit for discharging an electric charge generated in said piezoelectric sensor disposed in at least one of said piezoelectric sensor and said judging means;

drive means for driving said opening-closing unit; and control means for controlling said drive means so as to stop closing action of said opening-closing unit or open said opening-closing unit when said judging means judges the contact of the object with said pressure-sensitive sensor when said opening-closing unit is closing.

25. The opening-closing device of claim 24,
wherein said control means includes:
  a contact judging unit of said opening-closing unit for judging the contact of the object with said opening-closing unit on the basis of a detected drive state when said contact judging unit detects the drive state when said drive means drives said opening-closing unit; and
  a controller for controlling said drive means on the basis of an output signal from at least one of said object detecting device and said contact judging unit.

26. The opening-closing device of claim 25,
wherein said contact means controls said drive means on the basis of an output signal of said contact judging unit if abnormality occurs in said object detecting device.

27. The opening-closing device of claim 24,
wherein said control means controls said drive means so as to close after once moving said opening-closing unit by a specific distance in opening direction or opening for a specific time when closing said opening-closing unit.

* * * * *

UNITED STATES PATENT AND TRADEMARK OFFICE
CERTIFICATE OF CORRECTION

PATENT NO. : 6,747,399 B1
DATED : June 8, 2004
INVENTOR(S) : Ogino et al.

It is certified that error appears in the above-identified patent and that said Letters Patent is hereby corrected as shown below:

Column 20,
Line 63, delete "aid" and insert -- said --.

Column 22,
Line 13, delete "press sensitive" and insert -- pressure-sensitive --.
Line 30, delete "opening-losing" and insert -- opening-closing --.

Signed and Sealed this

Thirtieth Day of November, 2004

JON W. DUDAS
*Director of the United States Patent and Trademark Office*